United States Patent
Kong

(10) Patent No.: US 9,324,456 B2
(45) Date of Patent: Apr. 26, 2016

(54) SELF-DIAGNOSING METHOD OF A VOLATILE MEMORY DEVICE AND AN ELECTRONIC DEVICE PERFORMING THE SAME

(71) Applicant: SAMSUNG ELECTRONICS CO., LTD., Suwon-si, Gyeonggi-do (KR)

(72) Inventor: Jae-Sop Kong, Gwacheon-si (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 140 days.

(21) Appl. No.: 14/196,453

(22) Filed: Mar. 4, 2014

(65) Prior Publication Data

US 2014/0281736 A1 Sep. 18, 2014

(30) Foreign Application Priority Data

Mar. 15, 2013 (KR) ........................ 10-2013-0027985

(51) Int. Cl.
*G06F 11/00* (2006.01)
*G11C 29/44* (2006.01)
*G06F 11/10* (2006.01)
*G11C 29/50* (2006.01)
*G11C 29/52* (2006.01)
*G11C 29/04* (2006.01)

(52) U.S. Cl.
CPC .............. *G11C 29/44* (2013.01); *G06F 11/106* (2013.01); *G11C 29/50* (2013.01); *G11C 29/52* (2013.01); *G11C 2029/0409* (2013.01); *G11C 2029/5002* (2013.01)

(58) Field of Classification Search
CPC ... G06F 1/3275; G06F 1/3203; G06F 1/3268; G06F 11/106; G06F 2212/1028
See application file for complete search history.

(56) References Cited

U.S. PATENT DOCUMENTS

| | | | |
|---|---|---|---|
| 5,867,505 A | 2/1999 | Beffa | |
| 6,965,537 B1 * | 11/2005 | Klein | G06F 11/106 365/200 |
| 7,571,367 B2 | 8/2009 | Selva et al. | |
| 7,694,196 B2 | 4/2010 | Schnell et al. | |
| 8,832,483 B1 * | 9/2014 | Chudgar | G06F 1/3293 713/320 |
| 2003/0154417 A1 * | 8/2003 | Drexler | G06F 1/3228 713/400 |
| 2008/0091965 A1 * | 4/2008 | Nychka | G11C 11/4074 713/323 |
| 2008/0209294 A1 | 8/2008 | Brink et al. | |
| 2008/0222483 A1 * | 9/2008 | Ito | G06F 11/106 714/754 |
| 2011/0179321 A1 | 7/2011 | Takeuchi | |
| 2012/0159271 A1 | 6/2012 | Cho et al. | |
| 2013/0173970 A1 * | 7/2013 | Kleveland | G11C 29/44 714/710 |
| 2013/0326252 A1 * | 12/2013 | Ise | G06F 1/3234 713/323 |

FOREIGN PATENT DOCUMENTS

| | | |
|---|---|---|
| EP | 1 624 464 A1 | 2/2006 |
| KR | 1020000029847 | 5/2000 |
| KR | 1020090015506 | 2/2009 |
| KR | 1020090119917 | 11/2009 |

* cited by examiner

*Primary Examiner* — Charles Ehne
(74) *Attorney, Agent, or Firm* — F. Chau & Associates, LLC

(57) ABSTRACT

In a self-diagnosing method of a volatile memory device, a processor outputs a self-refresh entrance command and enters a power save mode, and a volatile memory device performs a self-diagnosing operation for a plurality of memory cells in response to the self-refresh entrance command while the processor is in the power save mode.

19 Claims, 14 Drawing Sheets

SELF-DIAGNOSING METHOD OF A VOLATILE MEMORY DEVICE AND AN ELECTRONIC DEVICE PERFORMING THE SAME

CROSS-REFERENCE TO RELATED APPLICATION

This application claims priority under 35 U.S.C. §119 to Korean Patent Application No. 10-2013-0027985, filed on Mar. 15, 2013, in the Korean Intellectual Property Office (KIPO), the disclosure of which is incorporated by reference herein in its entirety.

BACKGROUND

1. Technical Field

The inventive concept relates to a self-diagnosing method of a volatile memory device, and more particularly to a self-diagnosing method of a volatile memory device and an electronic device performing the same.

2. Discussion of the Related Art

During the use of a memory device, if a weak cell is generated, the reliability of the memory device may be degraded. Accordingly, the memory device may perform a self-diagnoses while operating.

However, if the memory device performs the self-diagnoses while operating, the performance of an electronic device including the memory device may be degraded.

SUMMARY

Exemplary embodiments of the inventive concept provide a self-diagnosing method of a volatile memory device, capable of performing a self-diagnosing operation without degrading performance.

Exemplary embodiments of the inventive concept provide an electronic device capable of implementing the self-diagnosing method of the volatile memory device.

In a self-diagnosing method of a volatile memory device according to exemplary embodiments of the inventive concept, a processor outputs a self-refresh entrance command and enters a power save mode, and a volatile memory device performs a self-diagnosing operation for a plurality of memory cells in response to the self-refresh entrance command while the processor is in the power save mode.

In exemplary embodiments of the inventive concept, the self-diagnosing operation may include determining if a self-diagnosing period is entered, and diagnosing the memory cells and storing a diagnosis result in a register in the self-diagnosing period.

The self-diagnosing operation may further include storing a diagnosis finish time in the register when the diagnosing of the memory cells is finished, and the entrance of the self-diagnosing period may be determined based on the diagnosis finish time stored in the register.

The diagnosing of the memory cells and the storing of the diagnosis result in the register may include dividing the memory cells into a plurality of sections, diagnosing the memory cells included in each section, section-by-section, and storing the diagnosis result and diagnosis-finished section information identifying the section where the diagnosing is finished in the register when the diagnosing of each of the sections is finished.

The self-diagnosing operation may further include setting a self-diagnosing stop bit to a first logic level if the self-diagnosing period is entered, setting the self-diagnosing stop bit to a second logic level if the diagnosing of all the sections is finished, and stopping the diagnosing of the memory cells if a self-refresh exit command is received from the processor.

The self-diagnosing operation may further include diagnosing the memory cells included in the sections next to the section where the diagnosing is finished based on the diagnosis-finished section information stored in the register and storing a diagnosis result in the register if the self-diagnosing stop bit has the first logic level, before determining if the self-diagnosing period is entered.

In exemplary embodiments of the inventive concept, the outputting of the self-refresh entrance command and the entering of the power save mode by the processor may include determining if a self-diagnosing period is entered, outputting the self-refresh entrance command and a self-diagnosing start command and entering the power save mode if the self-diagnosing period is entered, and outputting the self-refresh entrance command and entering the power save mode if the self-diagnosing period is not entered. The self-diagnosing operation may include diagnosing the memory cells and storing a diagnosis result in a register in response to the self-diagnosing start command.

The entrance of the self-diagnosing period may be determined based on a last diagnosis finish time stored in a non-volatile memory device.

The self-diagnosing operation may further include setting a self-diagnosing stop bit to a first logic level if the self-diagnosing start command is received, storing a diagnosis finish time in the register and setting the self-diagnosing stop bit to a second logic level if the diagnosing of all the memory cells is finished, and stopping the diagnosing of the memory cells if a self-refresh exit command is received from the processor.

The self-diagnosing method may further include providing the self-refresh exit command to the volatile memory device from the processor if the power save mode is terminated, and reading out the self-diagnosing stop bit and the diagnosis finish time from the volatile memory device with the processor after the power save mode is finished, and storing the diagnosis finish time in the non-volatile memory device as the last diagnosis finish time if the self-diagnosing stop bit has the second logic level.

The self-diagnosing method may further include determining if a self-diagnosing period is entered by using an auxiliary processor in response to the self-refresh entrance command, and providing a self-diagnosing start command to the volatile memory device from the auxiliary processor in the self-diagnosing period. The self-diagnosing operation may include diagnosing the memory cells in response to the self-diagnosing start command and storing a diagnosis result in a register.

The entrance of the self-diagnosing period may be determined based on a last diagnosis finish time stored in a non-volatile memory device.

The self-diagnosing operation may further include setting a self-diagnosing stop bit to a first logic level if the self-diagnosing start command is received, storing a diagnosis finish time in the register and setting the self-diagnosing stop bit to a second logic level if the diagnosing of all the memory cells is finished, and stopping the self-diagnosing operation if a self-refresh exit command is received from the processor.

The self-diagnosing method may further include outputting the self-refresh exit command from the processor if the power save mode is terminated, and reading out the self-diagnosing stop bit and the diagnosis finish time from the volatile memory device with the auxiliary processor until the auxiliary processor receives the self-refresh exit command, and storing the diagnosis finish time in the non-volatile memory device as the last diagnosis finish time if the self-diagnosing stop bit has the second logic level.

According to exemplary embodiments of the inventive concept, an electronic device includes a processor and a volatile memory device. The processor outputs a self-refresh entrance command and enters a power save mode, and the processor outputs a self-refresh exit command if the power save mode is terminated and a normal operation mode is entered. The volatile memory device performs a self-diagnosing operation for a plurality of memory cells in response to the self-refresh entrance command while the processor is in the power save mode, and the volatile memory device stops the self-diagnosing operation of the memory cells in response to the self-refresh exit command.

According to an exemplary embodiment of the inventive concept, a self-diagnosing method of a volatile memory device includes: receiving, at a volatile memory device, a self refresh command; and performing, at the volatile memory device, a self-diagnosis of memory cells included in the volatile memory device in response to the self refresh command, while a controller of the volatile memory device is in a low power mode The controller may be a processor.

The method may further include storing information of the diagnosis in the volatile memory device.

A control parameter of the memory cells may be adjusted based on the stored information.

The control parameter may include a refresh period or an operating voltage magnitude.

BRIEF DESCRIPTION OF THE DRAWINGS

The above and other features of the inventive concept will become more apparent by describing in detail exemplary embodiments thereof with reference to the accompanying drawings.

DETAILED DESCRIPTION OF THE EMBODIMENTS

Figure 1:
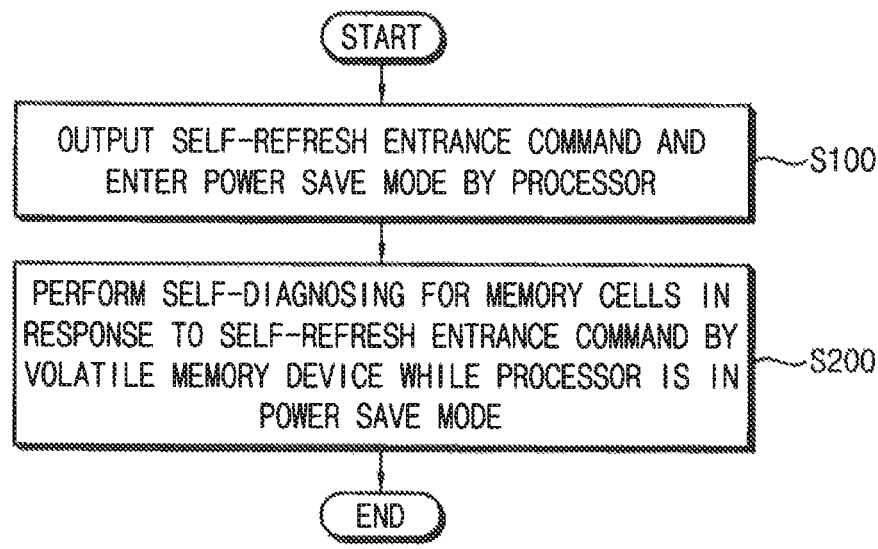
FIG. 1 is a flowchart illustrating a self-diagnosing method of a volatile memory device according to an exemplary embodiment of the inventive concept.

Exemplary embodiments of the inventive concept will be described more fully hereinafter with reference to the accompanying drawings. The present inventive concept may, however, be embodied in many different forms and should not be construed as limited to the embodiments set forth herein. Like reference numerals may refer to like elements throughout this application.

It will be understood that when an element is referred to as being "connected" or "coupled" to another element, it can be directly connected or coupled to the other element or intervening elements may be present.

As used herein, the singular forms "a," "an" and "the" are intended to include the plural forms as well, unless the context clearly indicates otherwise.

FIG. 1 is a flowchart illustrating a self-diagnosing method of a volatile memory device according to an exemplary embodiment of the inventive concept.

The self-diagnosing method of FIG. 1 may be performed in an electronic device including a processor and the volatile memory device.

Referring to FIG. 1, the processor outputs a self-refresh entrance command and enters a power save mode (step S100). The volatile memory device performs a self-diagnosing operation with respect to a plurality of memory cells included therein in response to the self-refresh entrance command while the processor is in the power save mode (step S200). The self-diagnosing operation performed by the volatile memory device may include various test operations for the memory cells.

As described above, since the volatile memory device performs the self-diagnosing operation while the processor is in the power save mode, the volatile memory device performs the self-diagnosing operation without degrading the performance of an electronic device.

Figure 2:
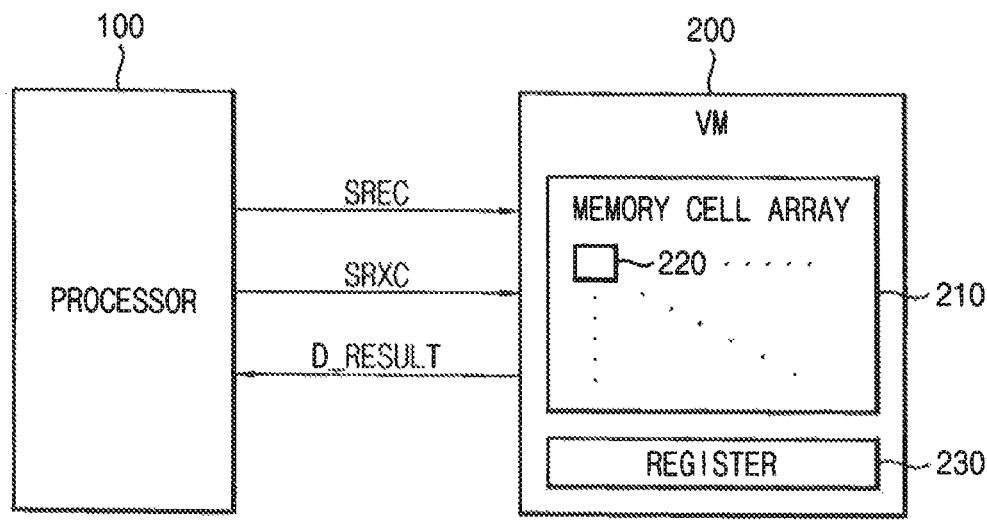
FIG. 2 is a block diagram illustrating an electronic device according to an exemplary embodiment of the inventive concept.

FIG. 2 is a block diagram illustrating an electronic device according to an exemplary embodiment of the inventive concept.

The self-diagnosing method of the volatile memory device may be performed by an electronic device 10 illustrated in FIG. 2.

As illustrated in FIG. 2, the electronic device 10 may include a processor 100 and a volatile memory device (VM) 200.

The volatile memory device 200 may include a memory cell array 210 including a plurality of memory cells 220 and a register 230.

Hereinafter, the self-diagnosing method of the volatile memory device of FIG. 1 will be described in detail with reference to FIG. 2.

The processor 100 outputs a self-refresh entrance command SREC and enters a power save mode (step S100). The volatile memory device 200 may perform a self-diagnosing operation for the memory cells 220 included in the volatile memory device 200 in response to the self-refresh entrance command SREC while the processor 100 is in the power save mode (step S200).

Figure 3:
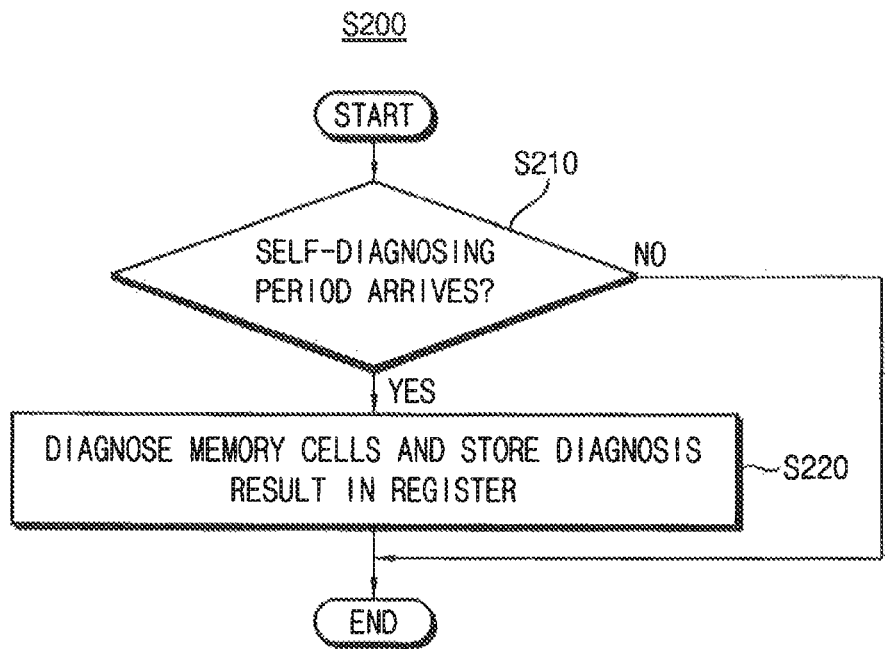
FIG. 3 is a flowchart illustrating a step of performing a self-diagnosing operation of FIG. 1 with the electronic device of FIG. 2, according to an exemplary embodiment of the inventive concept.

FIG. 3 is a flowchart illustrating the step (step S200) of performing the self-diagnosing operation of FIG. 1 with the electronic device 10 of FIG. 2, according to an exemplary embodiment of the inventive concept.

Referring to FIG. 3, when the volatile memory device 200 enters a self-refresh mode in response to the self-refresh entrance command SREC, the volatile memory device 200 determines if a self-diagnosing period arrives (step S210).

If the self-diagnosing period arrives according to the determination result, the volatile memory device 200 may diagnose the memory cells 220 and store a diagnosis result D_RESULT in the register 230 (step S220). The diagnosis result D_RESULT may include information of the position of a weak cell having a shorter data retention time among the memory cells 220. According to an exemplary embodiment of the inventive concept, the register 230 may include a mode register. According to an exemplary embodiment of the inventive concept, the register 230 may include a multi-purpose register (MPR).

If the self-diagnosing period does not arrive according to the determination result, the volatile memory device 200 may not perform the self-diagnosing operation for the memory cells 220.

In addition, the volatile memory device 200 may perform a self-refresh operation in response to the self-refresh entrance command SREC regardless of whether or not the self-diagnosing period arrives. For example, if the self-diagnosing period does not arrive, the volatile memory device 200 may perform only the self-refresh operation. If the self-diagnosing period arrives, the volatile memory device 200 may perform both of the self-diagnosing operation and the self-refresh operation for the memory cells 220.

Figure 4:
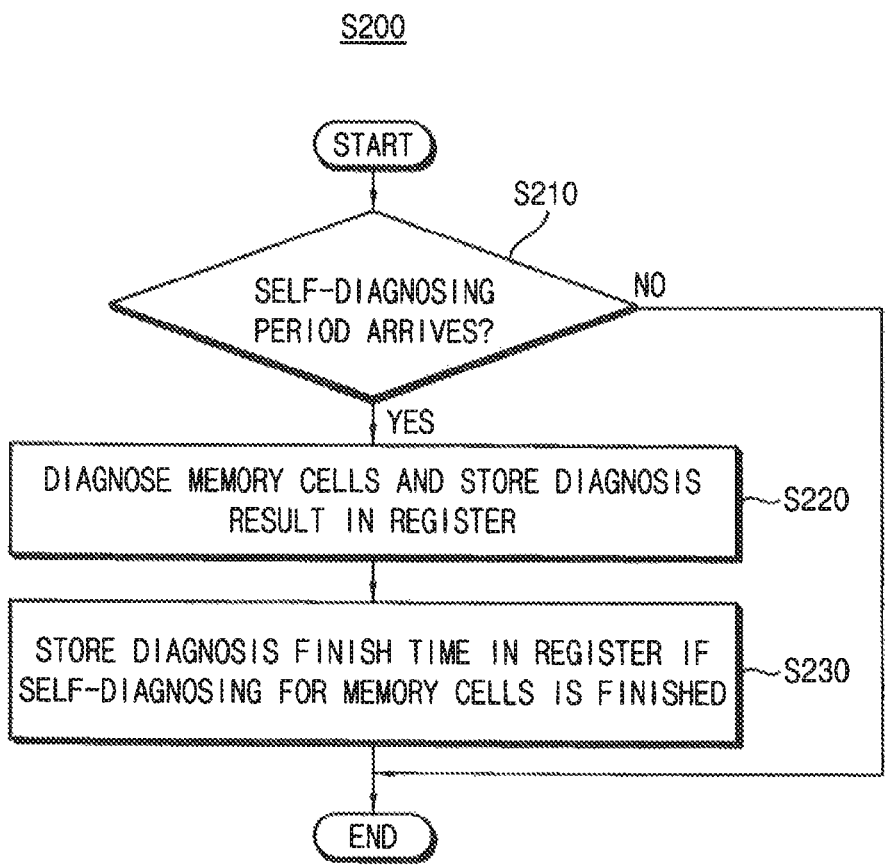
FIG. 4 is a flowchart illustrating the step of performing the self-diagnosing operation of FIG. 1 with the electronic device of FIG. 2, according to an exemplary embodiment of the inventive concept.

According to an exemplary embodiment of the inventive concept, as illustrated in FIG. 4, if the self-diagnosing operation for the memory cells 220 has been finished, the volatile memory device 200 may store a diagnosis finish time in the register 230 (step S230). In this case, when receiving the self-refresh entrance command SREC from the processor 100, the volatile memory device 200 may determine if the self-diagnosing period arrives based on the diagnosis finish time stored in the register 230. For example, the volatile memory device 200 may determine that the self-diagnosing period arrives if the difference between a time, at which the self-refresh entrance command SREC is received therein from the processor 100, and the diagnosis finish time stored in the register 230 is equal to or longer than the self-diagnosing period.

Figure 5:
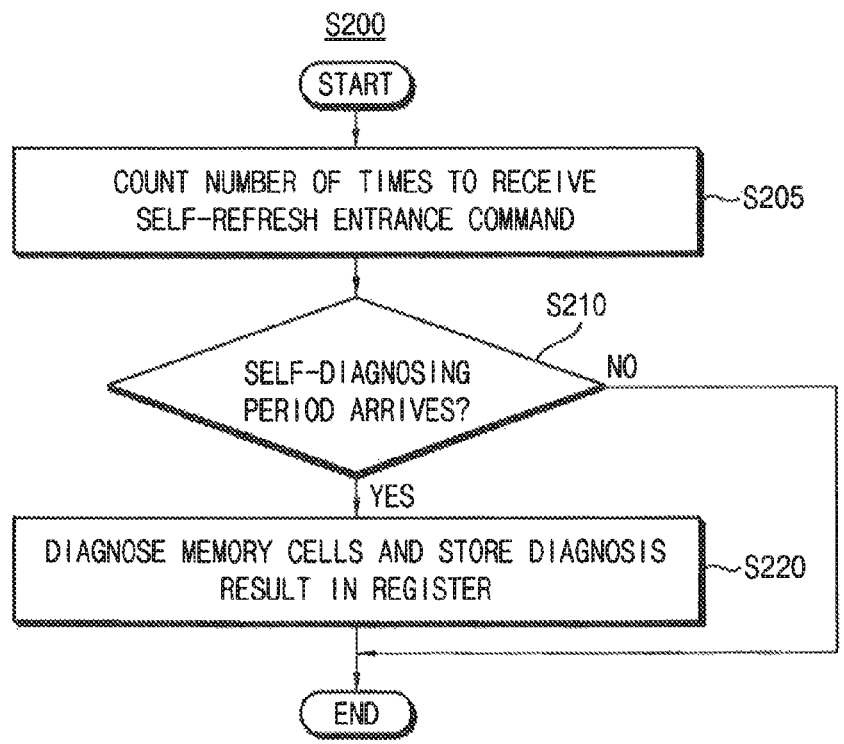
FIG. 5 is a flowchart illustrating the step of performing the self-diagnosing operation of FIG. 1 with the electronic device of FIG. 2, according to an exemplary embodiment of the inventive concept.

According to an exemplary embodiment of the inventive concept, as illustrated in FIG. 5, when the volatile memory device 200 receives the self-refresh entrance command SREC from the processor 100, the volatile memory device 200 may count the number of times to receive the self-refresh entrance command SREC (step S205). In this case, the volatile memory device 200 may determine if the self-diagnosing period arrives based on the count value. For example, the volatile memory device 200 may determine that the self-diagnosing period arrives if the number of times to receive the self-refresh entrance command SREC arrives is equal to a preset number.

Figure 6:
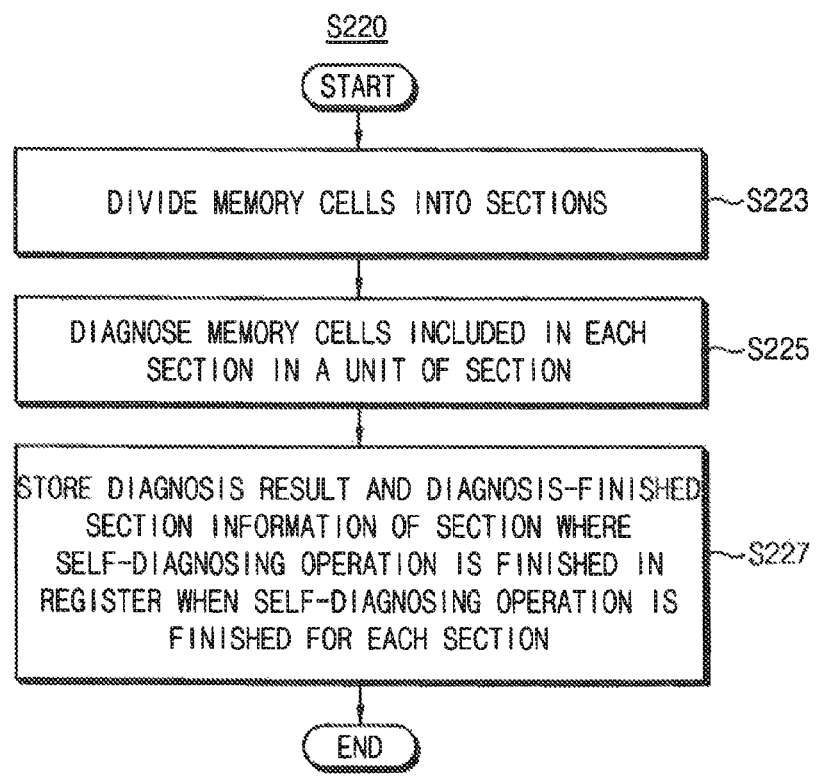
FIG. 6 is a flowchart illustrating a step of diagnosing a plurality of memory cells of FIG. 3 and storing the diagnosis result in a register, according to an exemplary embodiment of the inventive concept.

FIG. 6 is a flowchart illustrating the step (step S220) of diagnosing the memory cells of FIG. 3 and storing the diagnosis result in a register, according to an exemplary embodiment of the inventive concept.

If the volatile memory device 200 determines that the self-diagnosing period arrives, the volatile memory device 200 divides the memory cells 220 into a plurality of sections (step S223) to diagnose the memory cells 220 included in each section in the unit of a section (step S225). According to an exemplary embodiment of the inventive concept, the sections may correspond to a plurality of banks included in the memory cell array 210, respectively. According to an exemplary embodiment of the inventive concept, the sections may correspond to a plurality of blocks included in the memory cell array 210.

The volatile memory device 200 may store the diagnosis result D_RESULT and diagnosis-finished section information of a section where the self-diagnosing operation has been finished, in the register 230 when the self-diagnosing operation has been finished for each section (step S227). Accordingly, the volatile memory device 200 can recognize the sections where the self-diagnosing operation has been finished, based on the diagnosis-finished section information stored in the register 230.

Figure 7:
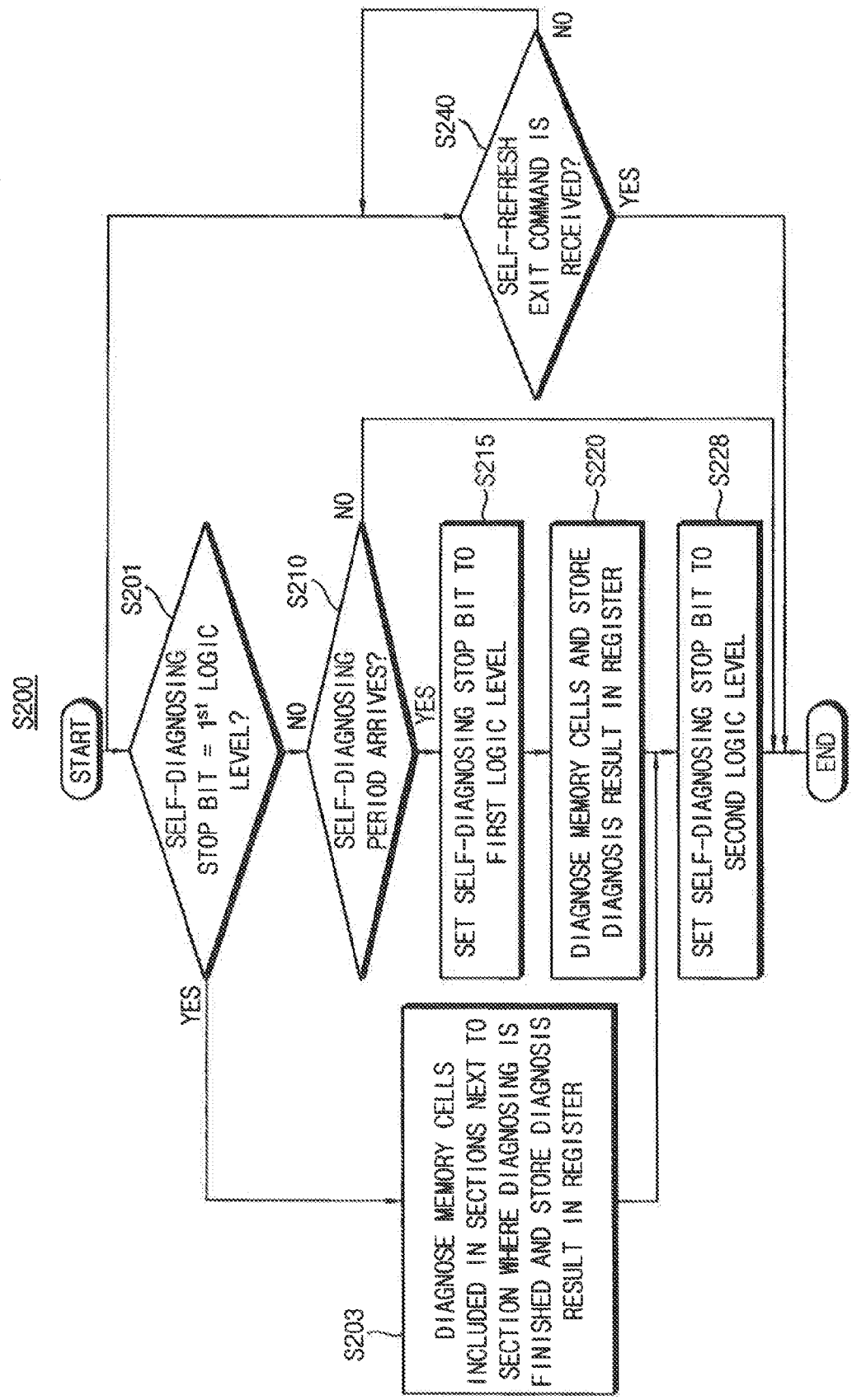
FIG. 7 is a flowchart illustrating the step of performing the self-diagnosing operation of FIG. 1 with the electronic device of FIG. 2, according to an exemplary embodiment of the inventive concept.

FIG. 7 is a flowchart illustrating the step of performing the self-diagnosing operation of FIG. 1 with the electronic device 10 of FIG. 2, according to an exemplary embodiment of the inventive concept.

In a step (S200) of performing the self-diagnosing operation illustrated in FIG. 7, several operations are performed in addition to the step (S200) of performing self-diagnosing illustrated in FIG. 7.

As illustrated in FIG. 7, if the volatile memory device 200 determines that the self-diagnosing period arrives (step 210), the volatile memory device 200 sets a self-diagnosing stop bit to a first logic level (step S215). If the self-diagnosing operation has been finished with respect to all sections, the volatile memory device 200 may set the self-diagnosing stop bit to a second logic level (step S228). The self-diagnosing stop bit may be stored in the register 230. In addition, if the processor 100 terminates the power save mode to enter a normal operation mode, the processor 100 provides a self-refresh exit command SRXC to the volatile memory device 200. If the volatile memory device 200 receives the self-refresh exit command SRXC from the processor 100 (step S240), the volatile memory device 200 may stop the self-diagnosing operation for the memory cells 220.

Accordingly, if the volatile memory device 200 receives the self-refresh exit command SRXC from the processor 100 after the self-diagnosing operation has been finished with respect to all sections, the self-diagnosing stop bit has the second logic level. If the volatile memory device 200 receives the self-refresh exit command SRXC from the processor 100 in the middle of performing the self-diagnosing operation for the sections so that the self-diagnosing operation is stopped, the self-diagnosing stop bit has the first logic level.

In this case, as illustrated in FIG. 7, when the volatile memory device 200 receives the self-refresh entrance command SREC from the processor 100, the volatile memory device 200 determines if the self-diagnosing period arrives after determining the logic level of the self-diagnosing stop bit (step S201).

The self-diagnosing stop bit having the first logic level indicates that the last self-diagnosing operation was stopped before the last self-diagnosing operation had been finished. Accordingly, the memory cells 220 included in the sections next to the section, where the self-diagnosing operation had been finished, are diagnosed based on the diagnosis-finished section information stored in the register 230 regardless of whether or not the self-diagnosing period arrives, and the diagnosis result D_RESULT may be stored in the register 230 (step S203). For example, after diagnosing the memory cells 220 included in each section next to the section, where the self-diagnosing operation had been finished, the diagnosis result D_RESULT and the diagnosis-finished section information representing the section, where the self-diagnosing operation had been finished, may be stored in the register 230 when the self-diagnosing operation is finished for each section. If the self-diagnosing operation had been finished with respect to all sections, the self-diagnosing stop bit may be set to the second logic level (step S228).

The self-diagnosing stop bit having the second logic level indicates that the last self-diagnosing operation has been normally finished. Accordingly, the self-diagnosing operation may be performed with respect to the memory cells 220 depending on whether or not the self-diagnosing period arrives.

In addition, the processor 100 may read out the diagnosis result D_RESULT from the register 230 of the volatile memory device 200 after the power save mode has been terminated. As described above, the diagnosis result D_RESULT may include the information of a position of a weak cell having a shorter data retention time from among the memory cells 220. Accordingly, the processor 100 may adjust a control parameter of the volatile memory device 200 based on the diagnosis result D_RESULT.

According to an exemplary embodiment of the inventive concept, the processor 100 may control a refresh period of the volatile memory device 200 based on the diagnosis result D_RESULT. For example, the processor 100 may set the refresh period for the section including the weak cell to a shorter period based on the diagnosis result D_RESULT.

According to an exemplary embodiment of the inventive concept, the processor 100 may control the magnitude of the operating voltage applied to the volatile memory device 200 based on the diagnosis result D_RESULT. For example, the processor 100 may increase the data retention time of the weak cell by increasing the magnitude of the operating voltage.

Referring to FIGS. 1 to 7, as described above, in the self-diagnosing method of the volatile memory device of the exemplary embodiments of the inventive concept, the volatile memory device 200 determines if the self-diagnosing period arrives while the processor 100 is in the power save mode. If the self-diagnosing period arrives according to the determination result, the volatile memory device 200 diagnoses the in memory cells 220, and the diagnosis result D_RESULT is stored in the register 230. The processor 100 may adjust the control parameter of the volatile memory device 200 by reading out the diagnosis result D_RESULT from the volatile memory device 200 after the power save mode has been terminated. Therefore, in the self-diagnosing method of the volatile memory device of the exemplary embodiments of the inventive concept, the self-diagnosing operation can be effectively performed without degrading the performance of the electronic device 10.

Figure 8:
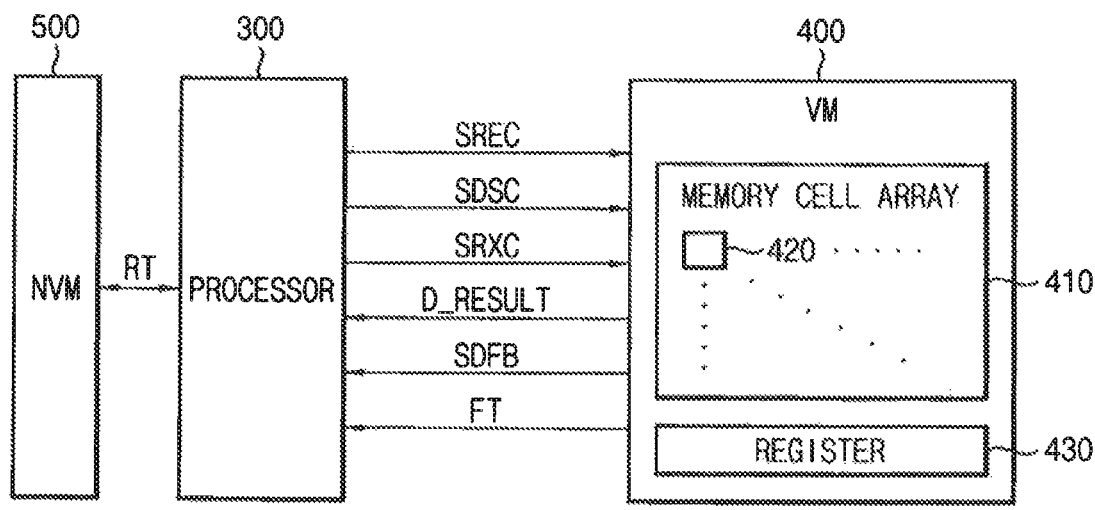
FIG. 8 is a block diagram illustrating an electronic device according to an exemplary embodiment of the inventive concept.

FIG. 8 is a block diagram illustrating an electronic device according to an exemplary embodiment of the inventive concept.

The self-diagnosing method of the volatile memory device of FIG. 1 may be performed by an electronic device 20 illustrated in FIG. 8.

As illustrated in FIG. 8, the electronic device 20 may include a processor 300, a volatile memory device (VM) 400, and a non-volatile memory device (NVM) 500.

The volatile memory device 400 may include a memory cell array 410 including a plurality of memory cells 420 and a register 430.

The non-volatile memory device 500 may be an Electrically Erasable Programmable Read-Only Memory (EEPROM), a flash memory, a Phase Change Random Access Memory (PRAM), a Resistance Random Access Memory (RRAM), a Nano Floating Gate Memory (NFGM), a Polymer Random Access Memory (PoRAM), a Magnetic Random Access Memory (MRAM), a Ferroelectric Random Access Memory (FRAM), or a memory similar thereto. According to an exemplary embodiment of the inventive concept, the non-volatile memory device 500 may be located outside the processor 300, or may be embedded in the processor 300.

Hereinafter, the self-diagnosing method of the volatile memory device of FIG. 1 will be described in detail with reference to FIG. 8.

Figure 9:
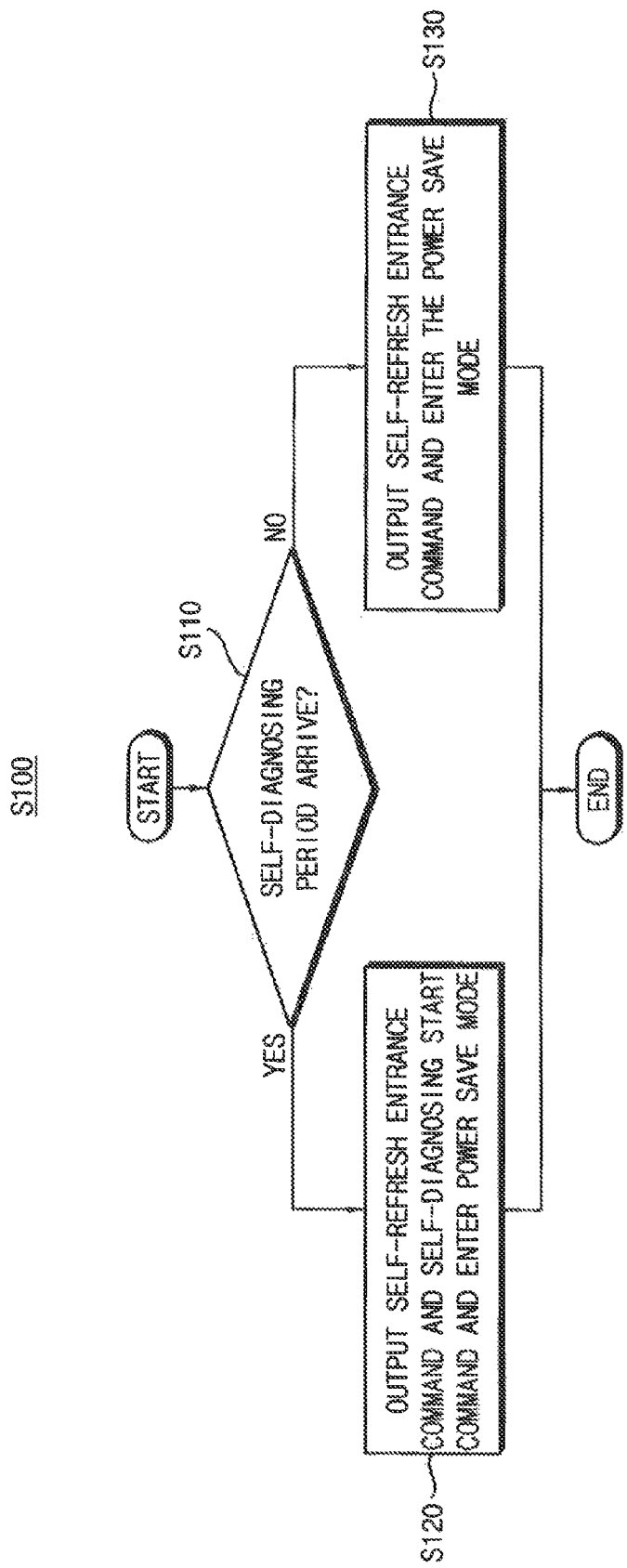
FIG. 9 is a flowchart illustrating a processor step of outputting a self-refresh entrance command and entering a power save mode as shown in FIG. 1 in the electronic device of FIG. 8, according to an exemplary embodiment of the inventive concept.

FIG. 9 is a flowchart illustrating a step (S100) of FIG. 1 in which a processor outputs the self-refresh entrance command and enters the power save mode in the electronic device 20 of FIG. 8, according to an exemplary embodiment of the inventive concept.

Referring to FIG. 9, when the processor 300 attempts to enter the power save mode, the processor 300 may determine if the self-diagnosing period arrives (step S110).

If the self-diagnosing period arrives according to the determination result, the processor 300 provides the self-refresh entrance command SREC and a self-diagnosing start command SDSC to the volatile memory device 400 and enters the power save mode (step S120).

If the self-diagnosing period does not arrive according to the determination result, the processor 300 may provide the self-refresh entrance command SREC to the volatile memory device 400 and enter the power save mode (step S130).

According to an exemplary embodiment of the inventive concept, the processor 300 may determine if the self-diagnosing period arrives based on a last diagnosis finish time RT stored in the non-volatile memory device 500. The last diagnosis finish time RT indicates the last time the volatile memory device 400 finished the self-diagnosing operation. For example, the processor 300 may determine that the self-diagnosing period arrives if the difference between a current time and the last diagnosis finish time RT stored in the non-volatile memory device 500 is equal to or greater than a preset self-diagnosing period. A method of storing the last diagnosis finish time RT in the non-volatile memory device 500 by the processor 300 will be described later.

According to an exemplary embodiment of the inventive concept, the processor 300 may count the number of times it provides the self-refresh entrance command SREC to the volatile memory device 400 and enters the power save mode, and may determine if the self-diagnosing period arrives based on the count value. For example, if the number of times the self-refresh entrance command SREC is provided to the volatile memory device 400 and the power save mode is entered equals a preset number, the processor 300 may determine that the self-diagnosing period arrives.

Figure 10:
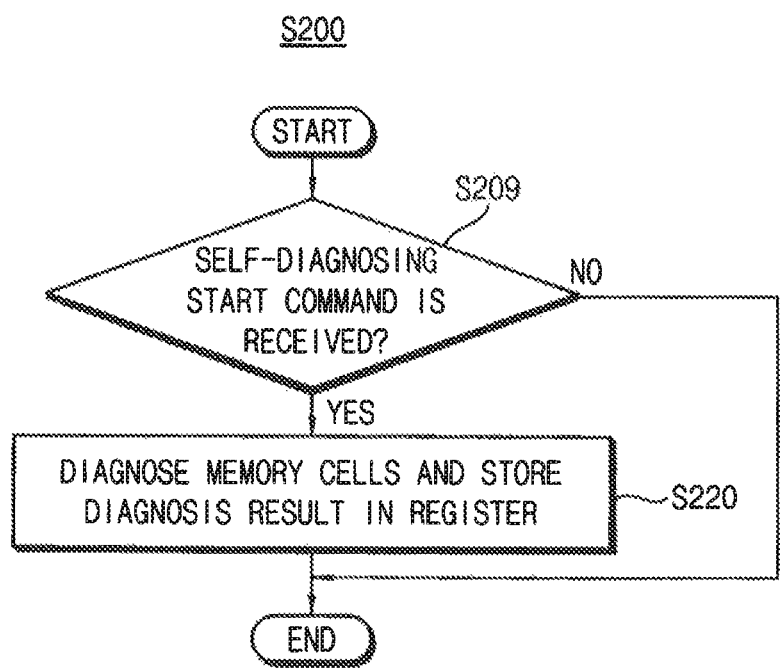
FIG. 10 is a flowchart illustrating the step of performing the self-diagnosing operation of FIG. 1 performed by the electronic device of FIG. 8, according to an exemplary embodiment of the inventive concept.

FIG. 10 is a flowchart illustrating the step of performing the self-diagnosing operation of FIG. 1 performed by the electronic device 20 of FIG. 8, according to an exemplary embodiment of the inventive concept.

Referring to FIG. 10, when the volatile memory device 400 enters the self-refresh mode in response to the self-refresh entrance command. SREC, the volatile memory device 400 may determine if the self-diagnosing start command SDSC is received from the processor 300 (step S209).

If the self-diagnosing start command SDSC is received, the volatile memory device 400 may diagnose the memory cells 420 and store the diagnosis result D_RESULT in the register 430 (step S220). The diagnosis result D_RESULT may include the information of a position of a weak cell having a shorter data retention time from among the memory cells 420. According to an exemplary embodiment of the inventive concept, the register 430 may include a mode register. According to an exemplary embodiment of the inventive concept, the register 430 may include an MPR.

If the self-diagnosing start command SDSC is not received, the volatile memory device 400 may not perform the self-diagnosing operation for the memory cells 420.

In addition, the volatile memory device 400 may perform a self-refresh operation in response to the self-refresh entrance command SREC regardless of whether or not the self-diagnosing start command SDSC is received. For example, the volatile memory device 400 may perform only the self-refresh operation if the self-diagnosing start command SDSC is not received from the processor 300, or may perform both of the self-diagnosing operation and the self-refresh operation with respect to the memory cells 420 if the self-diagnosing start command SDSC is received from the processor 300.

The step (S220) of diagnosing the memory cells and storing the diagnosis result in the register in FIG. 10 may be performed through the operations of FIG. 6.

Referring to FIG. 6, if the volatile memory device 400 receives the self-diagnosing start command SDSC, the volatile memory device 400 divides the memory cells 420 into a plurality of sections (step S223) to diagnose the memory cells 420 included in each section in the unit of a section (step S225). According to an exemplary embodiment of the inventive concept, the sections may correspond to a plurality of banks included in the memory cell array 410, respectively. According to an exemplary embodiment of the inventive concept, the sections may correspond to a plurality of blocks included in the memory cell array 410.

The volatile memory device 400 may store the diagnosis result D_RESULT and diagnosis-finished section information of a section, where the self-diagnosing operation has been finished, in the register 430 when the self-diagnosing operation has been finished for each section (step S227). Accordingly, the volatile memory device 400 can recognize the sections, where the self-diagnosing operation has been finished, based on the diagnosis-finished section information stored in the register 430.

Figure 11:
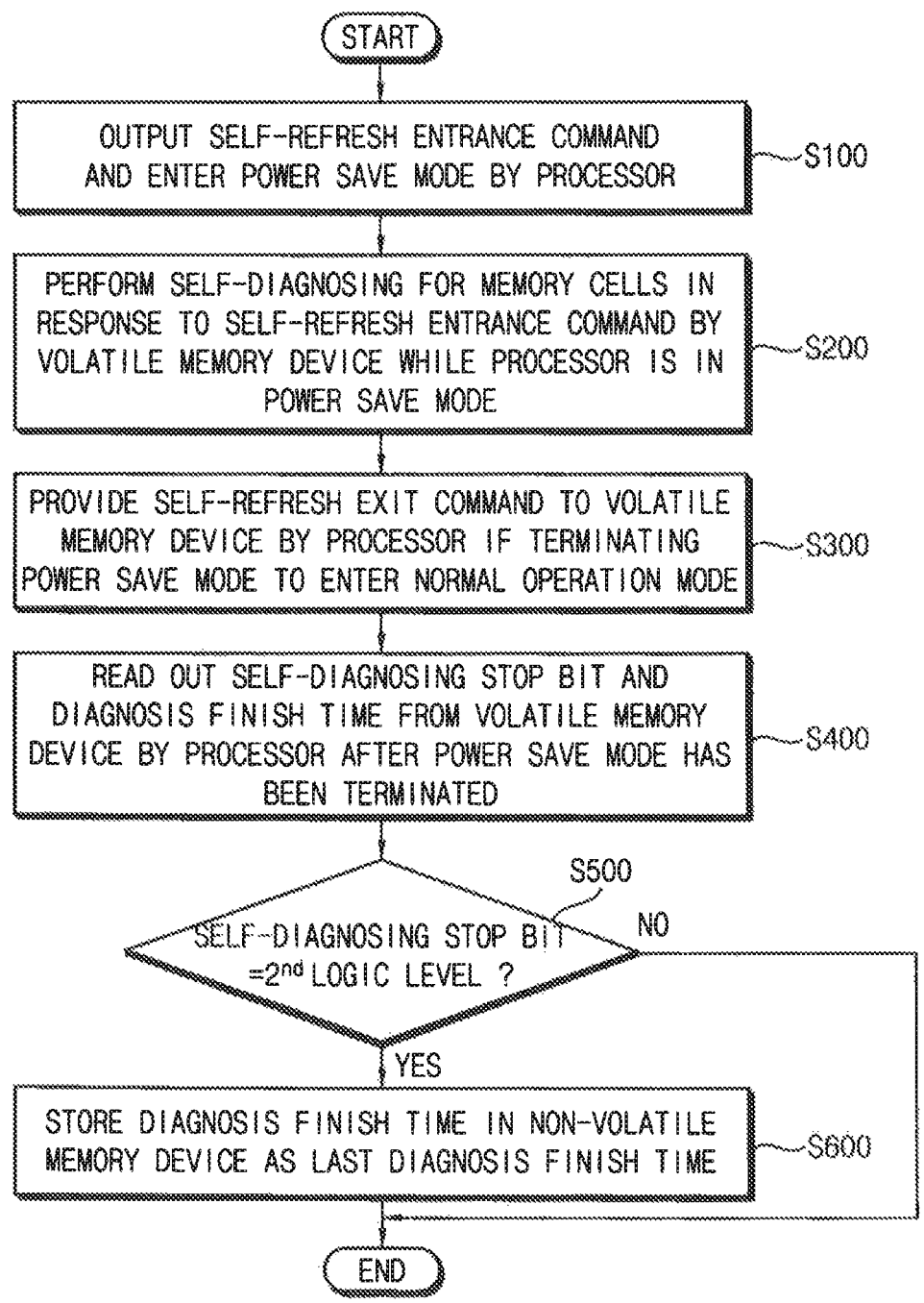
FIG. 11 is a flowchart illustrating the self-diagnosing method of the volatile memory device of FIG. 1 performed by the electronic device of FIG. 8, according to an exemplary embodiment of the inventive concept.
Figure 12:
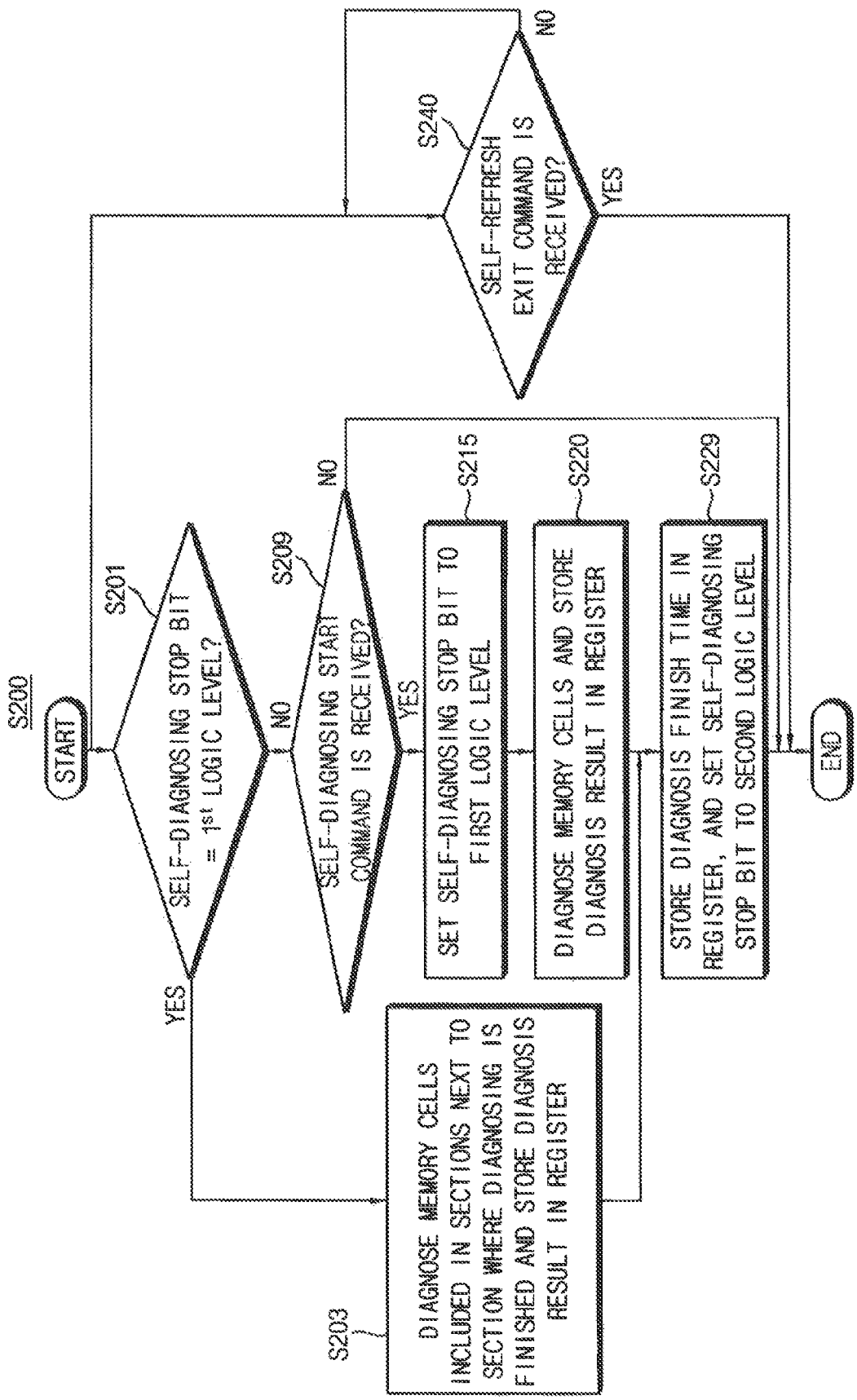
FIG. 12 is a flowchart illustrating the step of performing the self-diagnosing operation of FIG. 11 with the electronic device of FIG. 8, according to an exemplary embodiment of the inventive concept.

FIG. 11 is a flowchart illustrating the self-diagnosing method of the volatile memory device of FIG. 1 performed by the electronic 20 device of FIG. 8, according to an exemplary embodiment of the inventive concept. FIG. 12 is a flowchart illustrating the step (S200) of performing the self-diagnosing operation of FIG. 11 with the electronic device 20 of FIG. 8, according to an exemplary embodiment of the inventive concept.

In a step (S200) of performing the self-diagnosing operation illustrated FIG. 12, several operations are additionally performed in addition to the step (S200) of performing self-diagnosing illustrated in FIG. 10.

As illustrated in FIG. 12, if a self-diagnosing start command SDSC is received, the volatile memory device 400 sets a self-diagnosing stop bit SDFB to a first logic level (step S215). If the self-diagnosing operation has been finished with respect to all sections, the volatile memory device 400 stores a diagnosis finish time FT in the register 430, and may set the self-diagnosing stop bit SDFB to a second logic level (step S229). The self-diagnosing stop bit SDFB may be stored in the register 430.

In addition, as illustrated in FIG. 11, if the processor 300 terminates the power save mode to enter a normal operation mode, the processor 300 provides a self-refresh exit command SRXC to the volatile memory device 400 (step S300). As illustrated in FIG. 12, if the volatile memory device 400 receives the self-refresh exit command SRXC from the processor 300 (step S240), the volatile memory device 400 may stop the self-diagnosing operation for the memory cells 420.

Accordingly, if the volatile memory device 400 receives the self-refresh exit command SRXC from the processor 300 after the self-diagnosing operation has been finished with respect to all sections, the self-diagnosing stop bit SDFB has the second logic level. If the volatile memory device 400 receives the self-refresh exit command SRXC from the processor 300 in the middle of performing the self-diagnosing operation for the sections so that the self-diagnosing operation is stopped, the self-diagnosing stop bit SDFB may have the first logic level.

In this case, as illustrated FIG. 12, if the volatile memory device 400 receives the self-refresh entrance command SREC from the processor 300, the volatile memory device 400 may determine if the self-diagnosing start command SDSC is received after determining the logic level of the self-diagnosing stop bit SDFB (step S201).

The self-diagnosing stop bit SDFB having the first logic level indicates that the last self-diagnosing operation was stopped before the self-diagnosing operation had been finished. Accordingly, the memory cells 420 included in the sections next to the section, where the self-diagnosing operation had been finished, are diagnosed based on the diagnosis-finished section information stored in the register 430 regardless of whether or not the self-diagnosing start command SDSC is received, and the diagnosis result D_RESULT may be stored in the register 430 (step S203). For example, after diagnosing the memory cells 420 included in each section next to the section, where the self-diagnosing operation had been finished, the diagnosis result D_RESULT and the diagnosis-finished section information representing the section, where the self-diagnosing operation had been finished, may be stored in the register 430 when the self-diagnosing operation is finished for each section. If the self-diagnosing operation had been finished with respect to all sections, the diagnosis finish time FT is stored in the register 430, and the self-diagnosing stop bit SDFB may be set to the second logic level (step S229).

The self-diagnosing stop bit SDFB having the second logic level indicates that the last self-diagnosing operation had been normally finished. Accordingly, the self-diagnosing operation may be performed with respect to the memory cells 420 based on whether or not the self-diagnosing start command SDSC is received In addition, as illustrated in FIG. 11, the processor 300 may read out the self-diagnosing stop bit SDFB and the diagnosis finish time FT from the volatile memory device 400 after the power save mode has been terminated (step S400). Then, the logic level of the self-diagnosing stop bit SDFB is determined (step S500). If the self-diagnosing stop bit SDFB is the second logic level, the diagnosis finish time FT may be stored in the non-volatile memory device 500 as the last diagnosis finish time RT (step S600).

Accordingly, if the volatile memory device 400 normally terminates the self-diagnosing operation, the processor 300 updates the last diagnosis finish time RT stored in the non-volatile memory device 500 by using the diagnosis finish time FT read out from the volatile memory device 400. Therefore, when entering the power save mode after a preset period of time, which is equal to or greater than the self-diagnosing period, has been elapsed from the last diagnosis finish time RT, which was updated, the processor 300 provides the self-diagnosing start command SDSC to the volatile memory device 400, and the volatile memory device 400 may perform the self-diagnosing operation from the first section of the sections in response to the self-diagnosing start command. SDSC.

In addition, when the volatile memory device 400 receives the self-refresh exit command SRXC from the processor 300 in the middle of performing the self-diagnosing operation with respect to the sections to stop the self-diagnosing operation, the processor 300 does not update the last diagnosis finish time RT stored in the non-volatile memory device 400. Accordingly, when the processor 300 enters a next power save mode, the processor 300 provides the self-diagnosing start command SDSC to the volatile memory device 400, so that the volatile memory device 400 can perform the self-diagnosing operation with respect to sections next to the section, where the self-diagnosing operation has been finished, based on the diagnosis-finished section information stored in the register 430 in response to the self-diagnosing start command SDSC.

In addition, the processor 300 may read out the diagnosis result D_RESULT from the register 430 of the volatile memory device 400 after the power save mode has been terminated. As described above, the diagnosis result D_RESULT may include the information of a position of a weak cell having a shorter data retention time from among the memory cells 420. Accordingly the processor 300 may adjust a control parameter of the volatile memory device 400 based on the diagnosis result D_RESULT.

According to an exemplary embodiment of the inventive concept, the processor 300 may control a refresh period of the volatile memory device 400 based on the diagnosis result D_RESULT. For example, the processor 300 may set the refresh period for the section including the weak cell to a shorter period based on the diagnosis result D_RESULT.

According to an exemplary embodiment of the inventive concept, the processor 300 may control the magnitude of the operating voltage applied to the volatile memory device 400 based on the diagnosis result D_RESULT. For example, the processor 300 may increase the data retention time of the weak cell by increasing the magnitude of the operating voltage.

In the self-diagnosing method of the volatile memory device according to an exemplary embodiment of the inventive concept described with reference to FIGS. 1, 6 and 8 to 12, the processor 300 determines if the self-diagnosing period arrives before entering the power save mode. If the self-diagnosing period arrives according to the determination result, the processor 300 provides the self-diagnosing start command SDSC to the volatile memory device 400, and the volatile memory device 400 diagnoses the memory cells 420 while the processor 300 is in the power save mode, and stores the diagnosis result D_RESULT in the register 430. The processor 300 may read out the diagnosis result D_RESULT from the volatile memory device 400 after terminating the power save mode to adjust the control parameter of the volatile memory device 400. Therefore, in the self-diagnosing method of the volatile memory device according to the exemplary embodiments of the inventive concept, the self-diagnosing can be effectively performed without degrading the performance of the electronic device 20

Figure 13:
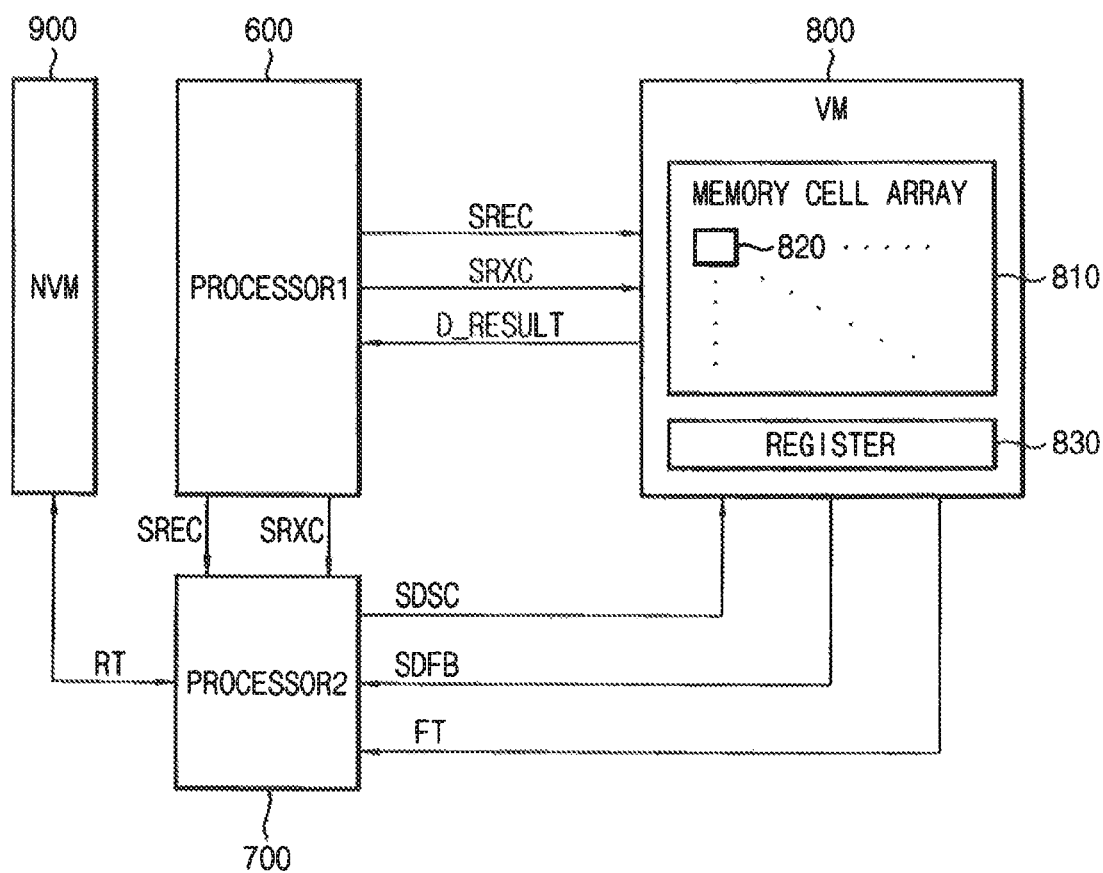
FIG. 13 is a block diagram illustrating an electronic device according to an exemplary embodiment of the inventive concept.

FIG. 13 is a block diagram illustrating an electronic device according to still an exemplary embodiment of the inventive concept.

The self-diagnosing method of the volatile memory device of FIG. 1 may be performed by an electronic device 30 illustrated in FIG. 13.

As illustrated in FIG. 13, the electronic device 30 may include a processor 600, an auxiliary processor 700, a volatile memory device (VM) 800, and a non-volatile memory device (NVM) 900.

The volatile memory device 800 may include a memory cell array 810 including a plurality of memory cells 820 and a register 830.

The non-volatile memory device 900 may be an EEPROM, a flash memory, a PRAM, an RRAM, an NFGM, a PoRAM, an MRAM, an FRAM, or a memory similar thereto. As illustrated in FIG. 13, the non-volatile memory device 900 may be located outside the auxiliary processor 700. According to an exemplary embodiment of the inventive concept, the non-volatile memory device 900 may be embedded in the auxiliary processor 700.

Hereinafter, the self-diagnosing method of the volatile memory of FIG. 1 will be described in detail with reference to FIG. 13.

Figure 14A:
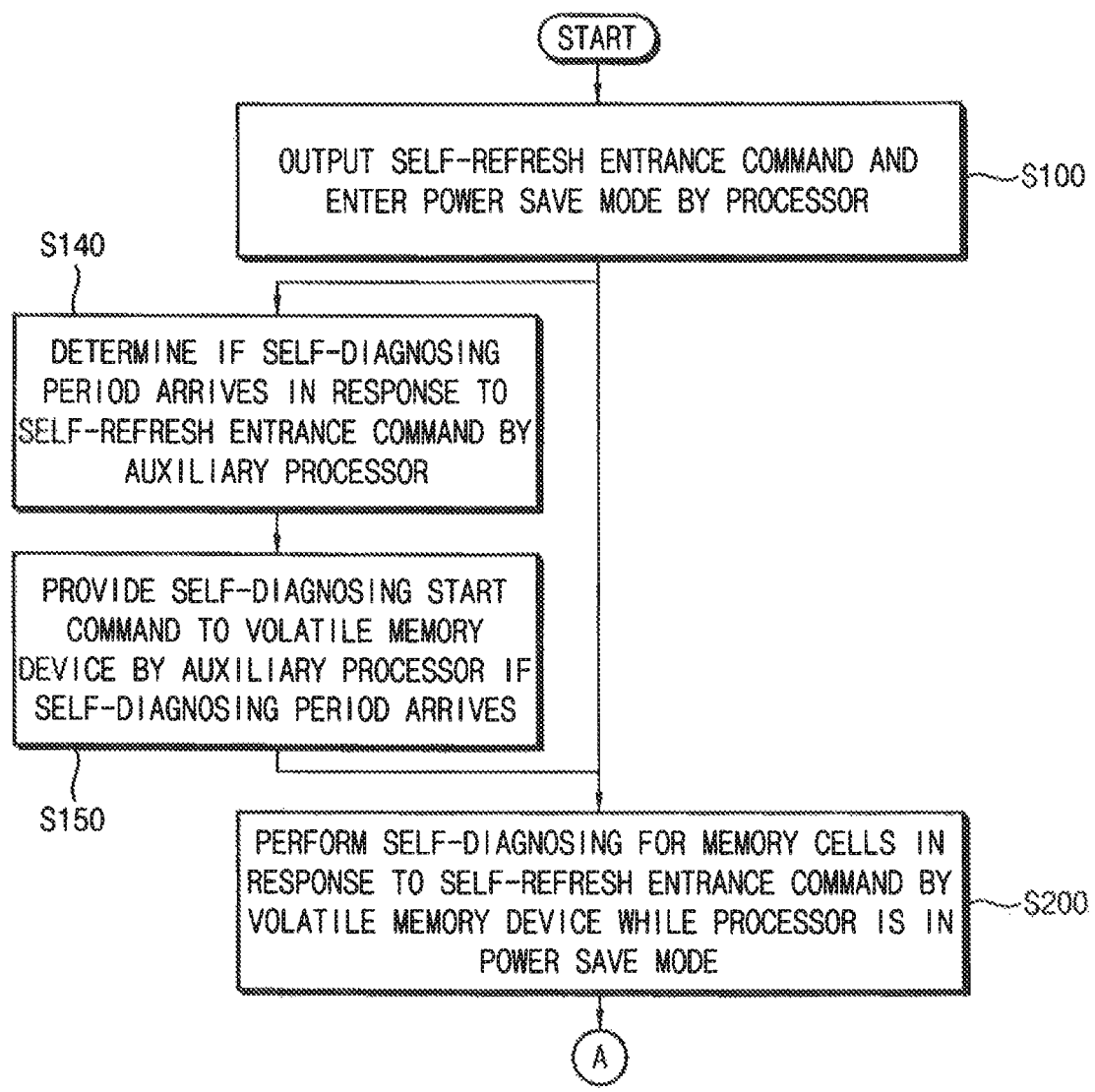
FIGS. 14A and 14B are flowcharts illustrating the self-diagnosing method of the volatile memory device of FIG. 1 performed by the electronic device of FIG. 13, according to an exemplary embodiment of the inventive concept.
Figure 14B:
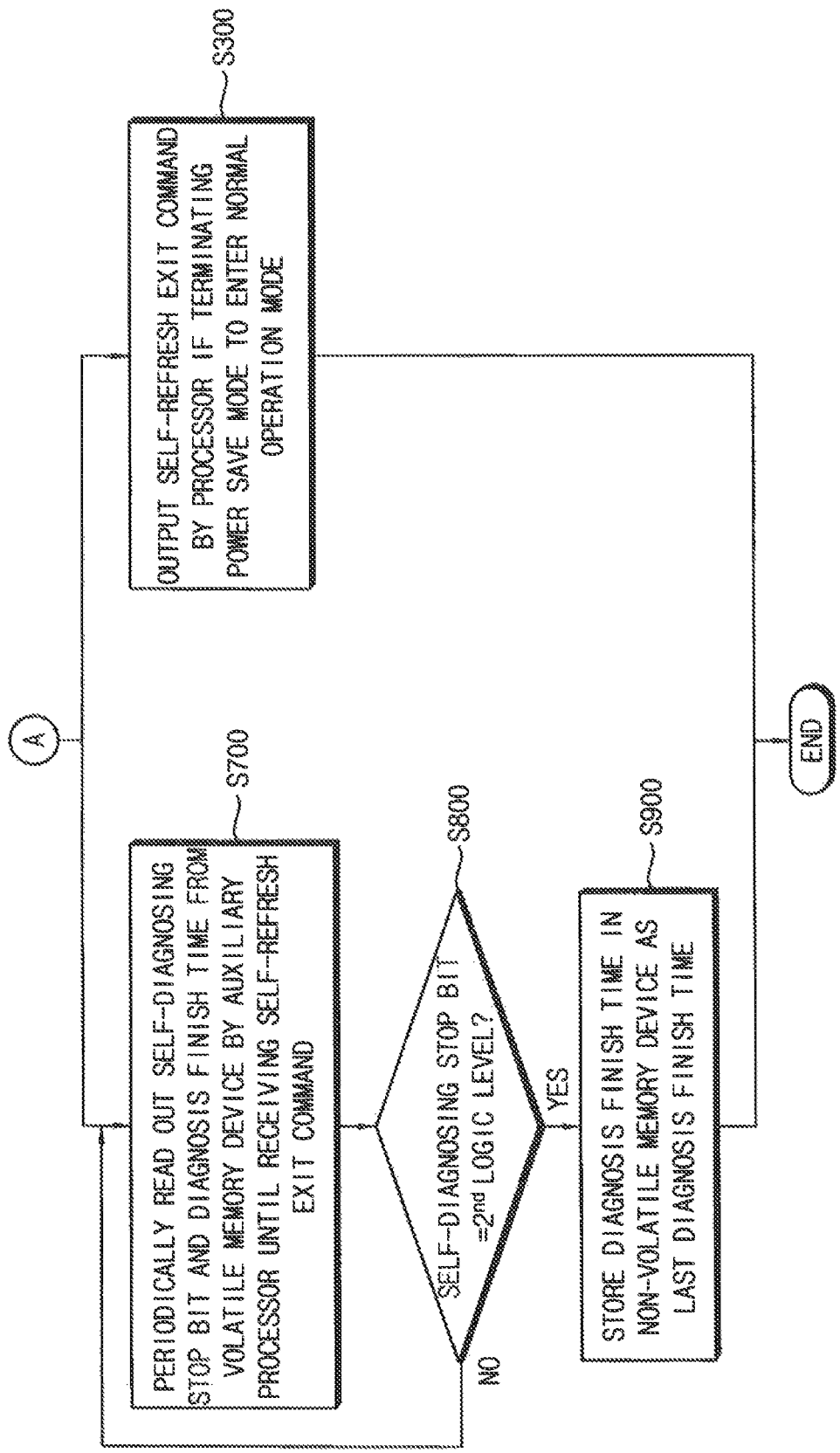

FIGS. 14A and 14B are flowcharts illustrating the self-diagnosing method of the volatile memory device of FIG. 1 performed by the electronic device 30 of FIG. 13, according to an exemplary embodiment of the inventive concept.

Referring to FIGS. 14A and 14B, the processor 600 may output the self-refresh entrance command SREC and enter a power save mode (step S100). The volatile memory device 800 may perform a self-diagnosing operation with respect to a plurality of the memory cells 820 included therein in response to the self-refresh entrance command SREC while the processor 600 is in the power save mode (step S200).

In addition, if the auxiliary processor 700 receives the self-refresh entrance command SREC from the processor 600, the auxiliary processor 700 may obtain control authority over the volatile memory device 800 and determine if the self-diagnosing period arrives (step S140). If the self-diagnosing period arrives according to the determination result, the auxiliary processor 700 may provide the self-diagnosing start command SDSC to the volatile memory device 800 (step S150).

According to an exemplary embodiment of the inventive concept, the auxiliary processor 700 may determine if the self-diagnosing period arrives based on the last diagnosis finish time RT stored in the non-volatile memory device 900. The last diagnosis finish time RT indicates a last time the volatile memory device 800 finished the last self-diagnosing operation. For example, the auxiliary processor 700 may determine that the self-diagnosing period arrives if the difference between a current time and the last diagnosis finish time RT stored in the non-volatile memory device 900 is equal to or greater than a preset self-diagnosing period. A method of storing the last diagnosis finish time RT in the non-volatile memory device 900 by the auxiliary processor 700 will be described later.

According to an exemplary embodiment of the inventive concept, the auxiliary processor 700 may count the number of times it receives the self-refresh entrance command SREC, and determine if the self-diagnosing period arrives based on the count value. For example, if the number of times the self-refresh entrance command SREC is received at the auxiliary processor 700 equals a preset number, the auxiliary processor 700 may determine that the self-diagnosing period arrives.

The step (S200) of performing a self-diagnosing operation of FIG. 14A performed by the electronic device 30 of FIG. 13 will be performed through the operations of FIG. 10.

Referring to FIG. 10, when the volatile memory device 800 enters the self-refresh mode in response to the self-refresh entrance command SREC, the volatile memory device 800 may determine if the self-diagnosing start command SDSC is received from the auxiliary processor 700 (step S209).

When the self-diagnosing start command SDSC is received, the volatile memory device 800 may diagnose the memory cells 820, and the diagnosis result D_RESULT may be stored in the register 830 (step S220). The diagnosis result D_RESULT may include the information of the position of a weak cell having a shorter data retention time among the memory cells 220. According to an exemplary embodiment of the inventive concept, the register 830 may include a mode register. According to an exemplary embodiment of the inventive concept, the register 830 may include an MPR.

If the self-diagnosing start command SDSC is not received, the volatile memory device 800 may not perform the self-diagnosing operation for the memory cells 820.

In addition, the volatile memory device 800 may perforin the self-refresh operation in response to the self-refresh entrance command SREC regardless of whether or not the self-diagnosing start command SDSC is received. For example, the volatile memory device 800 may perform only the self-refresh operation if the self-diagnosing start command SDSC is not received from the auxiliary processor 700, or may perform both of the self-diagnosing operation and the self-refresh operation with respect to the memory cells 820 if the self-diagnosing start command SDSC is received from the auxiliary processor 700.

The step (S220) of diagnosing the memory cells and storing the diagnosis result in the register in FIG. 10 may be performed through the operations of FIG. 6.

Referring to FIG. 6, if the self-diagnosing start command SDSC is received, the volatile memory device 800 divides the memory cells 820 into a plurality of sections (step S223) to diagnose the memory cells 820 included in each section in the unit of a section (step S225). According to an exemplary embodiment of the inventive concept, the sections may correspond to a plurality of banks included in the memory cell array 810, respectively. According to an exemplary embodiment of the inventive concept, the sections may correspond to a plurality of blocks included in the memory cell array 810.

The volatile memory device 800 may store the diagnosis result D_RESULT and diagnosis-finished section information of a section, where the self-diagnosing operation has been finished, in the register 830 when the self-diagnosing operation has been finished for each section (step S227). Accordingly, the volatile memory device 800 can recognize the sections, where the self-diagnosing operation has been finished, based on the diagnosis-finished section information stored in the register 830.

The step (S200) of performing a self-diagnosing operation of FIG. 14A performed by the electronic device 30 of FIG. 13 will be performed through the operations of FIG. 12.

As illustrated in FIG. 12, if a self-diagnosing start command SDSC is received, the volatile memory device 800 sets a self-diagnosing stop bit SDFB to the first logic level (step S215). If the self-diagnosing operation has been finished with respect to all sections, the volatile memory device 800 stores a diagnosis finish time FT in the register 830, and may set the self-diagnosing stop bit SDFB to a second logic level (step S229). The self-diagnosing stop bit SDFB may be stored in the register 830.

In addition, as illustrated in FIG. 14B, if the processor 600 terminates the power save mode to enter a normal operation mode, the processor 600 provides a self-refresh exit command SRXC to the volatile memory device 800 and the auxiliary processor 700 (step S300). As illustrated in FIG. 12, if the volatile memory device 800 receives the self-refresh exit command SRXC from the processor 600 (step S240), the volatile memory device 800 may stop the self-diagnosing operation for the memory cells 820.

Accordingly, if the volatile memory device 800 receives the self-refresh exit command SRXC from the processor 600 after the elf-diagnosing operation has been finished with respect to all sections, the self-diagnosing stop bit SDFB has the second logic level. If the volatile memory device 800 receives the self-refresh exit command SRXC from the processor 600 in the middle of performing the self-diagnosing operation for the sections so that the self-diagnosing operation is stopped, the self-diagnosing stop bit SDFB may have the first logic level.

In this case, as illustrated FIG. 12, if the volatile memory device 800 receives the self-refresh entrance command SREC from the processor 600, the volatile memory device 800 may determine if the self-diagnosing start command SDSC is received after determining the logic level of the self-diagnosing stop bit SDFB (step S201).

The self-diagnosing stop bit SDFB having the first logic level indicates that the last self-diagnosing operation was stopped before the last self-diagnosing operation had been finished. Accordingly, the memory cells 820 included in the sections next to the section, where the self-diagnosing operation had been finished, are diagnosed based on the diagnosis-finished section information stored in the register 830 regardless of whether or not the self-diagnosing start command SDSC is received, and the diagnosis result D_RESULT may be stored in the register 830. If the self-diagnosing operation had been finished with respect to all sections, the diagnosis finish time FT is stored in the register 830, and the self-diagnosing stop bit SDFB may be set to the second logic level (step S229).

The self-diagnosing stop bit SDFB having the second logic level indicates that the last self-diagnosing operation has been normally finished. Accordingly, the self-diagnosing operation may be performed with respect to the memory cells 820 depending on whether or not the self-diagnosing start command SDSC is received.

In addition, as illustrated in FIG. 14B, the auxiliary processor 700 periodically reads out the self-diagnosing stop bit SDFB and the diagnosis finish time FT from the volatile memory device 800 until receiving the self-refresh exit command SRXC from the processor 600 (step 700) and determines the logic level of the self-diagnosing stop bit SDFB (step S800). Accordingly, if the self-diagnosing stop bit SDFB is the second logic level, the diagnosis finish time FT may be stored in the non-volatile memory device 900 as the last diagnosis finish time RT (step S900).

When the auxiliary processor 700 receives the self-refresh exit command SRXC from the processor 600, the auxiliary processor 700 may return control authority over the volatile memory device 800 to the processor 600.

Accordingly, if the volatile memory device 800 normally terminates the self-diagnosing operation, the auxiliary processor 700 updates the last diagnosis finish time RT stored in the non-volatile memory device 900 by using the diagnosis finish time FT read out from the volatile memory device 800. Therefore, when the processor 600 enters the power save mode after a preset period of time, which is equal to or greater than the self-diagnosing period, has been elapsed from the last diagnosis finish time RT, which was updated, the auxiliary processor 700 provides the self-diagnosing start command SDSC to the volatile memory device 800, and the volatile memory device 400 may perform the self-diagnosing operation from the first section of the sections in response to the self-diagnosing start command SDSC.

In addition, when the volatile memory device 800 receives the self-refresh exit command SRXC from the processor 600 in the middle of performing the self-diagnosing operation for the sections to stop the self-diagnosing operation, the auxiliary processor 700 does not update the last diagnosis finish time RT stored in the non-volatile memory device 900. Accordingly, when the processor 600 enters a next power save mode, the auxiliary processor 700 provides the self-diagnosing start command SDSC to the volatile memory device 800, and the volatile memory device 800 may subsequently perform the self-diagnosing operation for the sections next to the section, where the self-diagnosing operation has been finished, based on the diagnosis-finished section information stored in the register 830 in response to the self-diagnosing start command SDSC.

In addition, the processor 600 may read out the diagnosis result D_RESULT stored in the register 830 of the volatile memory device 800 after the power save mode has been terminated. As described above, the diagnosis result D_RESULT may include the information of the position of a weak cell having a shorter data retention time among the memory cells 820. Accordingly, the processor 600 may adjust a control parameter of the volatile memory device 800 based on the diagnosis result D_RESULT.

According to an exemplary embodiment of the inventive concept, the processor 600 may control the refresh period of the volatile memory device 800 based on the diagnosis result D_RESULT. For example, the processor 600 may set the refresh period for the section including the weak cell to a shorter period based on the diagnosis result D_RESULT.

According to an exemplary embodiment of the inventive concept, the processor 600 may control the magnitude of the operating voltage applied to the volatile memory device 800 based on the diagnosis result D_RESULT. For example, the processor 600 may increase the data retention time of the weak cell by increasing the magnitude of the operating voltage.

In the self-diagnosing method of the volatile memory device of the exemplary embodiments of the inventive concept described with reference to FIGS. 1, 6, 10, 12, 13, 14A and 14B, while the processor 600 is in the power save mode, the auxiliary processor 700 determines if the self-diagnosing period arrives. If the self-diagnosing period arrives according to the determination result, the auxiliary processor 700 provides the self-diagnosing start command SDSC to the volatile memory device 800, and the volatile memory device 800 diagnoses the memory cells 820 and stores the diagnosis result D_RESULT in the register 830 while the processor 600 is in the power save mode. After the power save mode has been terminated, the processor 600 may read out the diagnosis result D_RESULT from the volatile memory device 800 to adjust the control parameter of the volatile memory device 800. Therefore, in the self-diagnosing method of the volatile memory device according to the exemplary embodiments of the inventive concept, the self-diagnosing operation can be effectively performed without degrading the performance of the electronic device 30.

Figure 15:
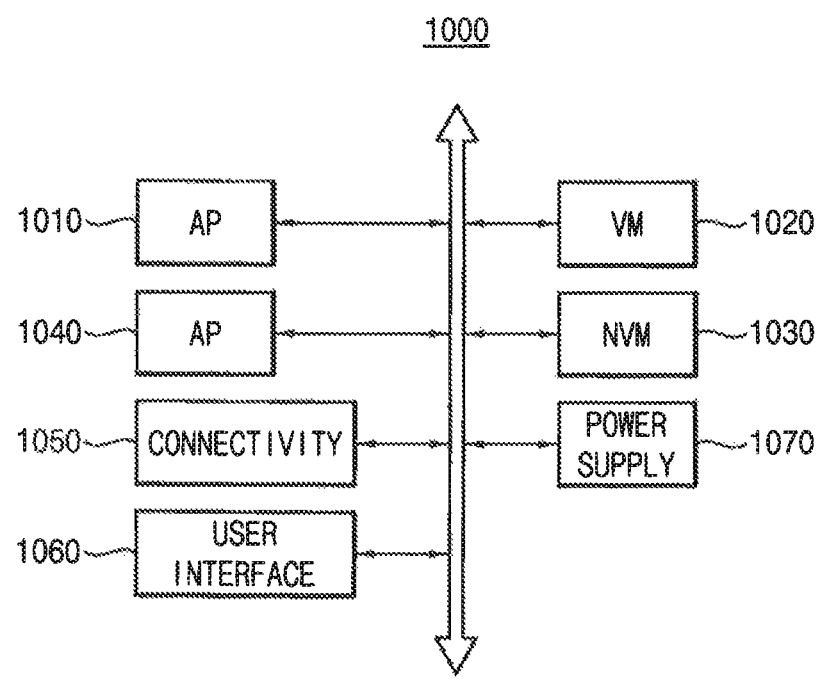
FIG. 15 is a block diagram illustrating a mobile system according to exemplary embodiments of the inventive concept.

FIG. 15 is a block diagram illustrating a mobile system according to exemplary embodiments of the inventive concept.

Referring to FIG. 15, a mobile system 1000 includes an application processor 1010, a volatile memory device (VM) 1020, a nonvolatile memory device (NVM) 1030, an auxiliary application processor 1040, a connectivity unit 1050, a user interface 1060 and a power supply 1070. In exemplary embodiments of the inventive concept, the mobile system 1000 may be a mobile phone, a smart phone, a personal digital assistant (PDA), a portable multimedia player (PMP), a digital camera, a music player, a portable game console, a navigation system, etc.

The application processor 1010 may execute applications, such as a web browser, a game application, a video player, etc. In exemplary embodiments of the inventive concept, the application processor 1010 may include a single core or multiple cores. For example, the application processor 1010 may be a multi-core processor, such as a dual-core processor, a quad-core processor, a hexa-core processor, etc. The application processor 1010 may include an internal or external cache memory. The application processor 1010 may control operations of the volatile memory device 1020 and the nonvolatile memory device 1030.

The volatile memory device 1020 may store data processed by the application processor 1010, or may operate as a working memory.

The nonvolatile memory device 1030 may store a boot image for booting the mobile system 1000. For example, the nonvolatile memory device 1030 may be an EEPROM, a flash memory, a PRAM, an RRAM, an NFGM, a PoRAM, an MRAM, an FRAM, etc.

The application processor 1010 may output a self-refresh entrance command and enter a power save mode. The application processor 1010 may output a self-refresh exit command if the power save mode is terminated and a normal operation mode is entered.

The volatile memory device 1020 may perform a self-diagnosing operation for a plurality of memory cells in response to the self-refresh entrance command while the application processor 1010 is in the power save mode. The volatile memory device 1020 may stop the self-diagnosing operation for the memory cells in response to the self-refresh exit command.

In exemplary embodiments of the inventive concept, the application processor 1010 and the volatile memory device 1020 may be implemented with the processor 100 and the volatile memory device 200 of FIG. 2. In this case, the application processor 1010 may output the self-refresh entrance command and enter the power save mode. When the volatile memory device 1020 enters a self-refresh mode in response to the self-refresh entrance command, the volatile memory device 1020 may determine if a self-diagnosing period arrives and perform a self-diagnosing operation with respect to the plurality of memory cells if the self-diagnosing period arrives.

In exemplary embodiments of the inventive concept, the application processor 1010, the volatile memory device 1020 and the nonvolatile memory device 1030 may be implemented with the processor 300, the volatile memory device 400 and the nonvolatile memory device 500 of FIG. 8. In this case, the application processor 1010 may determine if a self-diagnosing period arrives based on a last diagnosis finish time stored in the non-volatile memory device 1030 before entering the power save mode. If the self-diagnosing period arrives, the application processor 1010 may provide the self-refresh entrance command and a self-diagnosing start command to the volatile memory device 1020 and enter the power save mode, and the volatile memory device 1020 may diagnose the memory cells in response to the self-diagnosing start command.

In exemplary embodiments of the inventive concept, the application processor 1010, the auxiliary application processor 1040, the volatile memory device 1020 and the nonvolatile memory device 1030 may be implemented with the processor 600, the auxiliary processor 700, the volatile memory device 800 and the nonvolatile memory device 900 of FIG. 13. In this case, the application processor 1010 may output the self-refresh entrance command and enter the power save mode. When the auxiliary application processor 1040 receives the self-refresh entrance command, the auxiliary application processor 1040 may determine if the self-diagnosing period arrives based on the last diagnosis finish time stored in the non-volatile memory device 1030. If the self-diagnosing period arrives, the auxiliary application processor 1040 may provide the self-diagnosing start command to the volatile memory device 1020, and the volatile memory device 1020 may diagnose the memory cells in response to the self-diagnosing start command.

Operations of the electronic devices 10, 20 and 30 of FIGS. 2, 8, and 13 are described above with reference to FIGS. 1 to 14B. Therefore, a detailed description of the application processor 1010, the auxiliary application processor 1040, the volatile memory device 1020 and the nonvolatile memory device 1030 is omitted.

The connectivity unit 1050 may perform wired or wireless communication with an external device. For example, the connectivity unit 1050 may perform Ethernet communication, near field communication (NFC), radio frequency identification (RFID) communication, mobile telecommunication, memory card communication, universal serial bus (USB) communication, etc. In exemplary embodiments of the inventive concept, the connectivity unit 1050 may include a baseband chipset that supports communications, such as global system for mobile communications (GSM), general packet radio service (GPRS), wideband code division multiple access (WCDMA), high speed downlink/uplink packet access (HSxPA), etc.

The user interface 1060 may include at least one input device, such as a keypad, a touch screen, etc., and at least one output device, such as a speaker, a display device, etc. The power supply 1070 may supply a power supply voltage to the mobile system 1000.

In exemplary embodiments of the inventive concept, the mobile system 1000 may further include an image processor, and/or a storage device, such as a memory card, a solid state drive (SSD), a hard disk drive (HDD), a compact disk read only memory (CD-ROM), etc.

In exemplary embodiments of the inventive concept, the mobile system 1000 and/or components of the mobile system 1000 may be packaged in various forms, such as package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline integrated circuit (SOIC), shrink small outline package (SSOP), thin small outline package (TSOP), system in package (SIP), multi chip package (MCP), wafer-level fabricated package (WFP), or wafer-level processed stack package (WSP).

Figure 16:
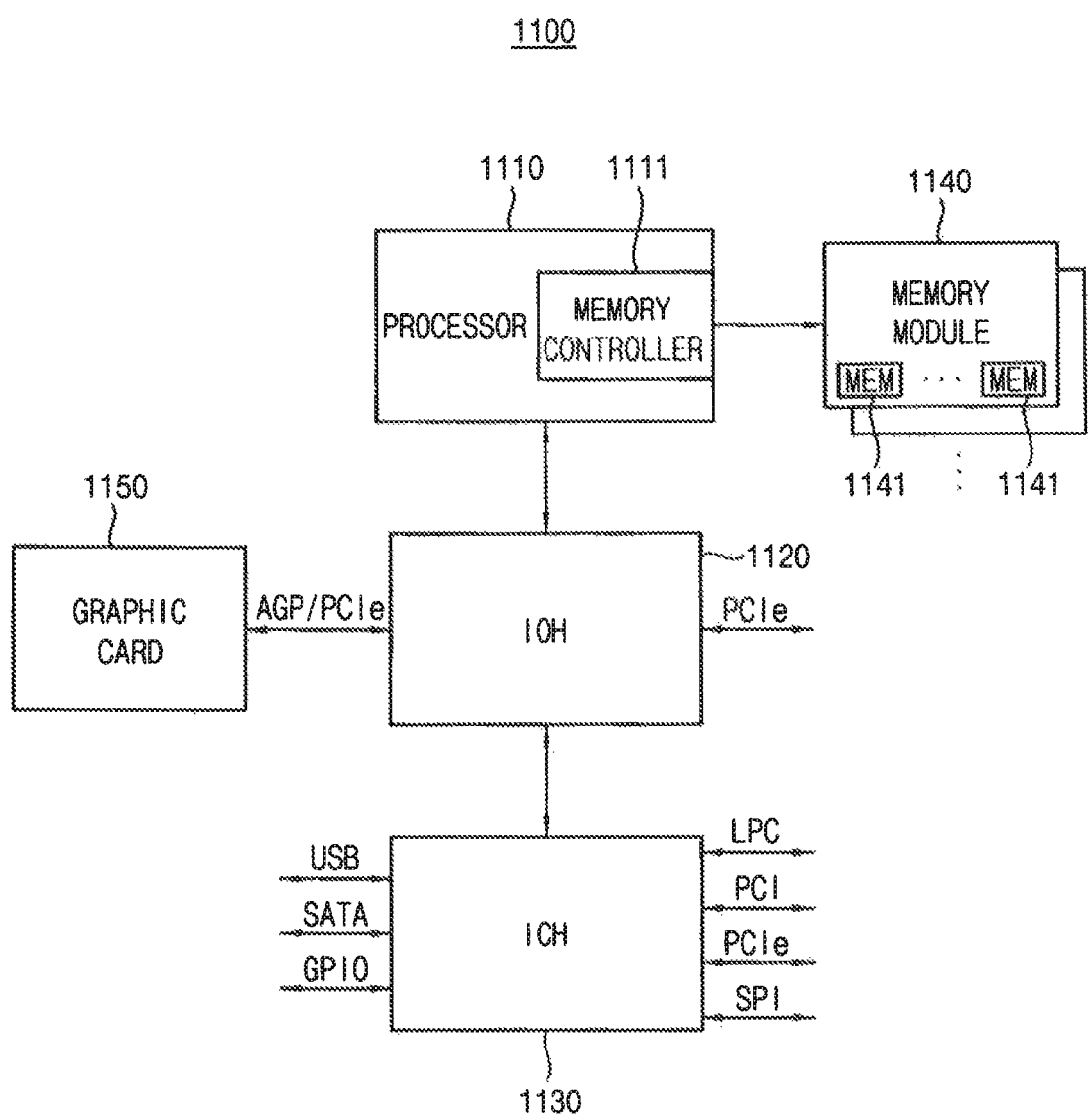
FIG. 16 is a block diagram illustrating a computing system according to exemplary embodiments of the inventive concept.

FIG. 16 is a block diagram illustrating a computing system according to exemplary embodiments of the inventive concept.

Referring to FIG. 16, a computing system 1100 includes a processor 1110, an input/output hub (IOH) 1120, an input/output controller hub (ICH) 1130, at least one memory module 1140 and a graphics card 1150. In exemplary embodiments of the inventive concept, the computing system 1100 may be a personal computer (PC), a server computer, a workstation, a laptop computer, a mobile phone, a smart phone, a PDA, a PMP, a digital camera, a digital television, a set-top box, a music player, a portable game console, a navigation system, etc.

The processor 1110 may perform various computing functions, such as executing specific software for performing specific calculations or tasks. For example, the processor 1110 may be a microprocessor, a central processing unit (CPU), a digital signal processor, or the like. In exemplary embodiments of the inventive concept, the processor 1110 may include a single core or multiple cores. For example, the processor 1110 may be a multi-core processor, such as a dual-core processor, a quad-core processor, a hexa-core processor, etc. Although FIG. 16 illustrates the computing system 1100 including one processor 1110, in exemplary embodiments of the inventive concept, the computing system 1100 may include a plurality of processors.

The processor 1110 may include a memory controller 1111 for controlling operations of the memory module 1140. The memory controller 1111 included in the processor 1110 may be an integrated memory controller (IMC). A memory interface between the memory controller 1111 and the memory module 1140 may be implemented with a single channel including a plurality of signal lines, or may be implemented with multiple channels, to each of which at least one memory module 1140 may be coupled. In exemplary embodiments of the inventive concept, the memory controller 1111 may be located inside the input/output hub 1120. The input/output hub 1120 including the memory controller 1111 may be a memory controller hub (MCH).

The memory module 1140 may include a plurality of memory devices MEM 1141 that store data provided from the memory controller 1111.

The processor 1110 may output a self-refresh entrance command and enter a power save mode. The processor 1110 may output a self-refresh exit command if the power save mode is terminated and a normal operation mode is entered.

The memory device 1141 may perform a self-diagnosing operation for a plurality of memory cells included in the memory device 1141 in response to the self-refresh entrance command while the processor 1110 is in the power save mode.

The processor 1110 and the memory device 1141 may be embodied with one of the electronic devices 10, 20 and 30 of FIGS. 2, 8, and 13. Operations of the electronic devices 10, 20 and 30 of FIGS. 2, 8, and 13 are described above with reference to FIGS. 1 to 14B. Therefore, a detailed description of the processor 1110 and the memory device 1141 is omitted.

The input/output hub 1120 may manage data transfer between processor 1110 and devices, such as the graphics card 1150. The input/output hub 1120 may be coupled to the processor 1110 via various interfaces. For example, the interface between the processor 1110 and the input/output hub 1120 may be a front side bus (FSB), a system bus, a Hyper Transport, a lightning data transport (LDT), a QuickPath interconnect (QPI), a common system interface (CSI), etc. The input/output hub 1120 may provide various interfaces with the devices. For example, the input/output hub 1120 may provide an accelerated graphics port (AGP) interface, a peripheral component interconnect-express (PCIe), a communications streaming architecture (CSA) interface, etc. Although FIG. 16 illustrates the computing system 1100 including one input/output hub 1120, in exemplary embodiments of the inventive concept, the computing system 1100 may include a plurality of input/output hubs.

The graphics card 1150 may be coupled to the input/output hub 1120 via AGP or PCIe. The graphics card 1150 may control a display device for displaying an image. The graphics card 1150 may include an internal processor for processing image data and an internal memory device. In exemplary embodiments of the inventive concept, the input/output hub 1120 may include an internal graphics device along with or instead of the graphics card 1150 outside the graphics card 1150. The graphics device included in the input/output hub 1120 may be integrated graphics. Further, the input/output hub 1120 including the internal memory controller and the internal graphics device may be a graphics and memory controller hub (GMCH).

The input/output controller hub 1130 may perform data buffering and interface arbitration to efficiently operate various system interfaces. The input/output controller hub 1130 may be coupled to the input/output hub 1120 via an internal bus, such as a direct media interface (DMI), a hub interface, an enterprise Southbridge interface (ESI), PCIe, etc.

The input/output controller hub 1130 may provide various interfaces with peripheral devices. For example, the input/output controller hub 1130 may provide a universal serial bus (USB) port, a serial advanced technology attachment (SATA) port, a general purpose input/output (GPIO), a low pin count (LPC) bus, a serial peripheral interface (SPI), PCI, PCIe, etc.

In exemplary embodiments of the inventive concept, the processor 1110, the input/output hub 1120 and the input/output controller hub 1130 may be separate chipsets or separate integrated circuits. In exemplary embodiments of the inventive concept, at least two of the processor 1110, the input/output hub 1120 and the input/output controller hub 1130 may be a single chipset.

While the inventive concept has been particularly shown and described with reference to exemplary embodiments thereof, it will be apparent to those of ordinary skill in the art that various changes in form and detail may be made therein without departing from the spirit and scope of the inventive concept as defined by the following claims.

What is claimed is:

1. A self-diagnosing method of a volatile memory device, the self-diagnosing method comprising:
outputting, from a processor, a self-refresh entrance command and entering a power save mode; and
performing, at a volatile memory device, a self-diagnosing operation for a plurality of memory cells in response to the self-refresh entrance command while the processor is in the power save mode,
wherein the self-diagnosing operation includes identifying a position of a memory cell with a short data retention time.

2. The self-diagnosing method of claim 1, wherein the self-diagnosing operation comprises:
determining if a self-diagnosing period is entered; and
diagnosing the memory cells and storing a diagnosis result in a register in the self-diagnosing period.

3. The self-diagnosing method of claim 2, wherein the self-diagnosing operation further comprises:
storing a diagnosis finish time in the register when the diagnosing of the memory cells is finished, and
wherein the entrance of a next self-diagnosing period is determined based on the diagnosis finish time stored in the register.

4. The self-diagnosing method of claim 2, wherein the diagnosing of the memory cells and the storing of the diagnosis result in the register comprises:
dividing the memory cells into a plurality of sections;
diagnosing the memory cells included in each section, section-by-section; and
storing the diagnosis result and diagnosis-finished section information identifying the section where the diagnosing is finished in the register when the diagnosing for each of the sections is finished.

5. The self-diagnosing method of claim 4, wherein the self-diagnosing operation further comprises:
setting a self-diagnosing stop bit to a first logic level if the self-diagnosing period is entered;
setting the self-diagnosing stop bit to a second logic level if the diagnosing of all the sections is finished; and
stopping the diagnosing of the memory cells if a self-refresh exit command is received from the processor.

6. The self-diagnosing method of claim 5, wherein the self-diagnosing operation further comprises:
diagnosing the memory cells included in the sections next to the section where the diagnosing is finished based on the diagnosis-finished section information stored in the register and storing a diagnosis result in the register if the self-diagnosing stop bit has the first logic level, before determining if the self-diagnosing period is entered.

7. The self-diagnosing method of claim 1, wherein the outputting of the self-refresh entrance command and the entering of the power save mode by the processor comprises:
determining if a self-diagnosing period is entered;
outputting the self-refresh entrance command and a self-diagnosing start command and entering the power save mode if the self-diagnosing period is entered; and
outputting the self-refresh entrance command and entering the power save mode if the self-diagnosing period is not entered, and
wherein the self-diagnosing operation comprises:
diagnosing the memory cells and storing a diagnosis result in a register in response to the self-diagnosing start command.

8. The self-diagnosing method of claim 7, wherein the entrance of the self-diagnosing period is determined based on a last diagnosis finish time stored in a non-volatile memory device.

9. The self-diagnosing method of claim 8, wherein the self-diagnosing operation further comprises:
setting a self-diagnosing stop bit to a first logic level if the self-diagnosing start command is received;
storing a diagnosis finish time in the register and setting the self-diagnosing stop bit to a second logic level if the diagnosing of all the memory cells is finished; and
stopping the diagnosing of the memory cells if a self-refresh exit command is received from the processor.

10. The self-diagnosing method of claim 9, further comprising:
providing the self-refresh exit command to the volatile memory device from the processor if the power save mode is terminated; and
reading out the self-diagnosing stop bit and the diagnosis finish time from the volatile memory device with the processor after the power save mode is finished, and storing the diagnosis finish time in the non-volatile memory device as the last diagnosis finish time if the self-diagnosing stop bit has the second logic level.

11. The self-diagnosing method of claim 1, further comprising:
   determining if a self-diagnosing period is entered by using an auxiliary processor in response to the self-refresh entrance command; and
   providing a self-diagnosing start command to the volatile memory device from the auxiliary processor in the self-diagnosing period,
   wherein the self-diagnosing operation comprises:
   diagnosing the memory cells in response to the self-diagnosing start command and storing a diagnosis result in a register.

12. The self-diagnosing method of claim 11, wherein the entrance of the self-diagnosing period is determined based on a last diagnosis finish time stored in a non-volatile memory device.

13. The self-diagnosing method of claim 12, wherein the self-diagnosing operation further comprises:
   setting a self-diagnosing stop bit to a first logic level if the self-diagnosing start command is received;
   storing a diagnosis finish time in the register and setting the self-diagnosing stop bit to a second logic level if the diagnosing of all the memory cells is finished; and
   stopping the self-diagnosing operation if a self-refresh exit command is received from the processor.

14. The self-diagnosing method of claim 13, further comprising:
   outputting the self-refresh exit command from the processor if the power save mode is terminated; and
   reading out the self-diagnosing stop bit and the diagnosis finish time from the volatile memory device with the auxiliary processor until the auxiliary processor receives the self-refresh exit command, and storing the diagnosis finish time in the non-volatile memory device as the last diagnosis finish time if the self-diagnosing stop bit has the second logic level.

15. An electronic device, comprising:
   a processor configured to output a self-refresh entrance command and enter a power save mode, the processor outputting a self-refresh exit command if the power save mode is terminated and a normal operation mode is entered; and
   a volatile memory device configured to perform a self-diagnosing operation for a plurality of memory cells in response to the self-refresh entrance command while the processor is in the power save mode, the volatile memory device stopping the self-diagnosing operation of the memory cells in response to the self-refresh exit command,
   wherein the self-diagnosing operation comprises:
   determining if a self-diagnosing period is entered; and
   diagnosing the memory cells and storing a diagnosis result in a register in the self-diagnosing period,
   wherein the diagnosing of the memory cells and the storing of the diagnosis result in the register comprises:
   dividing the memory cells into a plurality of sections;
   diagnosing the memory cells included in each section, section-by-section; and
   storing the diagnosis result and diagnosis-finished section information identifying the section where the diagnosing is finished in the register when the diagnosing for each of the sections is finished.

16. A self-diagnosing method of a volatile memory device, the self-diagnosing method comprising:
   receiving, at a volatile memory device, a self refresh command; and
   performing, at the volatile memory device, a self-diagnosis of memory cells included in the volatile memory device in response to the self refresh command, while a controller of the volatile memory device is in a low power mode,
   wherein the self-diagnoses comprises:
   determining if a self-diagnoses period is entered; and
   diagnosing the memory cells and storing a diagnosis result in a register in the self-diagnoses period,
   wherein the self-diagnoses further comprises:
   storing a diagnosis finish time in the register when the diagnoses of the memory cells is finished, and
   wherein the entrance of a next self-diagnoses period is determined based on the diagnosis finish time stored in the register.

17. The method of claim 16, wherein the controller is a processor.

18. The method of claim 16, wherein a control parameter of the memory cells is adjusted based on the stored information.

19. The method of claim 18, wherein the control parameter includes a refresh period or an operating voltage magnitude.

* * * * *